United States Patent
Park et al.

(10) Patent No.: US 10,913,754 B2
(45) Date of Patent: Feb. 9, 2021

(54) LANTHANUM COMPOUND AND METHODS OF FORMING THIN FILM AND INTEGRATED CIRCUIT DEVICE USING THE LANTHANUM COMPOUND

(71) Applicant: SAMSUNG ELECTRONICS CO., LTD., Suwon-si (KR)

(72) Inventors: Gyu-hee Park, Hwaseong-si (KR); Youn-soo Kim, Yongin-si (KR); Jae-soon Lim, Seoul (KR); Youn-joung Cho, Hwaseong-si (KR); Kazuki Harano, Tokyo (JP); Haruyoshi Sato, Tokyo (JP); Tsubasa Shiratori, Tokyo (JP); Naoki Yamada, Tokyo (JP)

(73) Assignees: SAMSUNG ELECTRONICS CO., LTD., Suwon-si (KR); ADEKA CORPORATION, Tokyo (JP)

( * ) Notice: Subject to any disclaimer, the term of this patent is extended or adjusted under 35 U.S.C. 154(b) by 0 days.

(21) Appl. No.: 16/251,236

(22) Filed: Jan. 18, 2019

(65) Prior Publication Data

US 2019/0152996 A1     May 23, 2019

Related U.S. Application Data

(63) Continuation-in-part of application No. 15/092,953, filed on Apr. 7, 2016, now Pat. No. 10,329,312.

(30) Foreign Application Priority Data

Jul. 7, 2015    (KR) .................. 10-2015-0096785
Mar. 16, 2018   (KR) .................. 10-2018-0031127

(51) Int. Cl.
*C07F 5/00*     (2006.01)
*C23C 16/455*   (2006.01)
(Continued)

(52) U.S. Cl.
CPC ............. *C07F 5/00* (2013.01); *C23C 16/34* (2013.01); *C23C 16/405* (2013.01);
(Continued)

(58) Field of Classification Search
None
See application file for complete search history.

(56) References Cited

U.S. PATENT DOCUMENTS 7,081,421 B2    7/2006  Ahn et al.
8,012,536 B2    9/2011  Shenai-Khatkhate et al.
(Continued)

FOREIGN PATENT DOCUMENTS

CN   101792469 A   8/2010
CN   102057077 A   5/2011
(Continued)

OTHER PUBLICATIONS

Office action dated Aug. 1, 2019 in the corresponding Chinese Application No. 201610529169.5.
(Continued)

*Primary Examiner* — Clinton A Brooks
(74) *Attorney, Agent, or Firm* — Lee IP Law, P.C.

(57) ABSTRACT

A lanthanum compound, a method of synthesizing a thin film, and a method of manufacturing an integrated circuit device, the compound being represented by Formula 1 below,

[Formula 1]

(Continued)

wherein, in Formula 1, $R^1$ is a hydrogen atom or a C1-C4 linear or branched alkyl group, $R^2$ and $R^3$ are each independently a hydrogen atom or a C1-C5 linear or branched alkyl group, at least one of $R^2$ and $R^3$ being a C3-C5 branched alkyl group, and $R^4$ is a hydrogen atom or a C1-C4 linear or branched alkyl group.

15 Claims, 32 Drawing Sheets

(51) Int. Cl.
| | |
|---|---|
| C23C 16/34 | (2006.01) |
| H01L 27/28 | (2006.01) |
| H01L 51/00 | (2006.01) |
| C23C 16/40 | (2006.01) |
| H01L 21/02 | (2006.01) |
| H01L 29/78 | (2006.01) |
| H01L 51/05 | (2006.01) |
| H01L 29/66 | (2006.01) |

(52) U.S. Cl.
CPC .... *C23C 16/45553* (2013.01); *H01L 21/0228* (2013.01); *H01L 21/02192* (2013.01); *H01L 27/281* (2013.01); *H01L 51/001* (2013.01); *H01L 51/0026* (2013.01); *H01L 29/66795* (2013.01); *H01L 29/785* (2013.01); *H01L 51/0089* (2013.01); *H01L 51/0512* (2013.01)

(56) References Cited

U.S. PATENT DOCUMENTS

| | | | |
|---|---|---|---|
| 8,071,452 B2 | 12/2011 | Raisanen | |
| 8,206,784 B2 | 6/2012 | Xu et al. | |
| 8,236,381 B2 | 8/2012 | Okubo | |
| 8,283,201 B2 * | 10/2012 | Pallem | C23C 16/18 438/99 |
| 8,617,305 B2 | 12/2013 | Lei et al. | |
| 8,617,649 B2 | 12/2013 | Dussarrat et al. | |
| 8,809,849 B2 | 8/2014 | Pallem et al. | |
| 8,877,655 B2 | 11/2014 | Shero et al. | |
| 9,099,301 B1 * | 8/2015 | Lansalot-Matras | H01L 21/02192 |
| 9,534,285 B2 | 1/2017 | Xu et al. | |
| 9,711,347 B2 | 7/2017 | Pallem et al. | |
| 2004/0164357 A1 | 8/2004 | Ahn et al. | |
| 2006/0072281 A1 | 4/2006 | Nam et al. | |
| 2007/0059447 A1 | 3/2007 | Kim et al. | |
| 2008/0102205 A1 | 5/2008 | Barry et al. | |
| 2009/0117274 A1 | 5/2009 | Ma et al. | |
| 2010/0034719 A1 | 2/2010 | Dussarrat et al. | |
| 2010/0290968 A1 | 11/2010 | Ma et al. | |
| 2011/0184156 A1 | 7/2011 | Jones | |
| 2016/0315168 A1 | 10/2016 | Dussarrat et al. | |
| 2017/0008914 A1 | 1/2017 | Park et al. | |

FOREIGN PATENT DOCUMENTS

| | | |
|---|---|---|
| GB | 2391555 A | 2/2004 |
| JP | 2011514433 A | 5/2011 |
| JP | 2011522833 A | 8/2011 |
| KR | 10-0590051 B1 | 6/2006 |
| KR | 10-0684992 B1 | 2/2007 |
| KR | 10-2017-0006205 A | 1/2017 |
| TW | 200938653 A | 9/2009 |
| TW | 201002855 A | 1/2020 |
| WO | WO 2004/046417 A2 | 6/2004 |
| WO | WO 2007/129670 A1 | 11/2007 |

OTHER PUBLICATIONS

Taiwanese Notice of Allowance dated Nov. 26, 2019 for corresponding application TW 105121474.

C.K. Chiang, et al., "Effects of $La_2O_3$ Capping Layers Prepared by Different ALD Lanthanum Precursors on Flatband Voltage Tuning and EOT Scaling in $TiN/HfO_2/SiO_2/Si$ MOS Structures", Journal of the Electrochemical Society, 158 (4), H447-H451, 2011.

* cited by examiner

LANTHANUM COMPOUND AND METHODS OF FORMING THIN FILM AND INTEGRATED CIRCUIT DEVICE USING THE LANTHANUM COMPOUND

CROSS-REFERENCE TO RELATED APPLICATION

This application is a continuation-in-part of U.S. patent application Ser. No. 15/092,953, filed on Apr. 7, 2016, entitled "Lanthanum Compound, Method of Synthesizing Lanthanum Compound, Lanthanum Precursor Composition, Method of Forming Thin Film, and Method of Manufacturing Integrated Circuit Device," which is hereby incorporated by reference in its entirety.

Korean Patent Application No. 10-2018-0031127, filed on Mar. 16, 2018, in the Korean Intellectual Property Office, and entitled: "Lanthanum Compound, and Methods of Forming Thin Film and Integrated Circuit Device Using the Lanthanum Compound," and Korean Patent Application No. 10-2015-0096785, filed on Jul. 7, 2015, in the Korean Intellectual Property Office, and entitled: "Lanthanum Compound, Method of Synthesizing Lanthanum Compound, Lanthanum Precursor Composition, Method of Forming Thin Film, and Method of Manufacturing Integrated Circuit Device," are incorporated by reference herein in their entirety.

BACKGROUND

1. Field

Embodiments relate to a lanthanum compound, and a method of forming a thin film and an integrated circuit device by using the lanthanum compound.

2. Description of the Related Art

With the development of electronic technology, semiconductor devices have been rapidly down-scaled. Accordingly, patterns constituting an electronic device have been miniaturized. Also, various studies have been conducted about integrated circuit devices providing high operation speed and high reliability.

SUMMARY

The embodiments may be realized by providing a lanthanum compound represented by Formula 1 below,

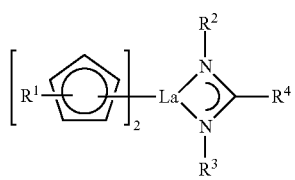

[Formula 1]

wherein, in Formula 1, $R^1$ is a hydrogen atom or a C1-C4 linear or branched alkyl group, $R^2$ and $R^3$ are each independently a hydrogen atom or a C1-C5 linear or branched alkyl group, at least one of $R^2$ and $R^3$ being a C3-C5 branched alkyl group, and $R^4$ is a hydrogen atom or a C1-C4 linear or branched alkyl group.

The embodiments may be realized by providing a method of synthesizing a thin film, the method including forming a lanthanum-containing film on a substrate by using a lanthanum compound that is a liquid at a temperature between 20° C. to 28° C., wherein the lanthanum compound is represented by Formula 1, below,

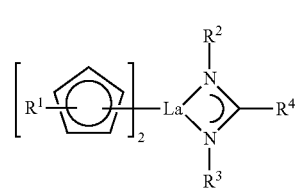

[Formula 1]

wherein, in Formula 1, $R^1$ is a hydrogen atom or a C1-C4 linear or branched alkyl group, $R^2$ and $R^3$ are each independently a hydrogen atom or a C1-C5 linear or branched alkyl group, at least one of $R^2$ and $R^3$ being a C3-C5 branched alkyl group, and $R^4$ is a hydrogen atom or a C1-C4 linear or branched alkyl group.

The embodiments may be realized by providing a method of manufacturing an integrated circuit device, the method including forming a lower structure on a substrate; and forming a lanthanum-containing film on the lower structure by using a lanthanum compound represented by Formula 1 below, and which is a liquid at 20° C. to 28° C.,

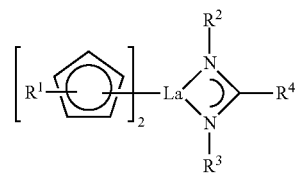

[Formula 1]

wherein, in Formula 1, $R^1$ is a hydrogen atom or a C1-C4 linear or branched alkyl group, $R^2$ and $R^3$ are each independently a hydrogen atom or a C1-C5 linear or branched alkyl group, at least one of $R^2$ and $R^3$ being a C3-C5 branched alkyl group, and $R^4$ is a hydrogen atom or a C1-C4 linear or branched alkyl group.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
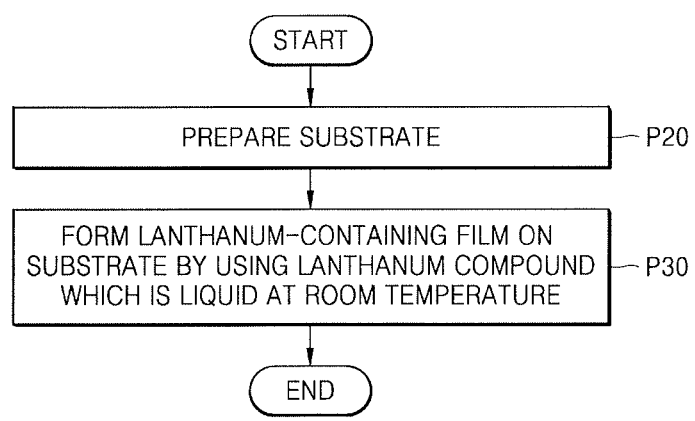
FIG. 1 illustrates a flowchart of a method of forming a thin film, according to embodiments.

The term "substrate" used herein may denote the substrate itself or a stacking structure including the substrate and a predetermined layer or a film formed on a surface of the substrate. Also, the term "a surface of a substrate" used herein may denote either an exposed surface of the substrate itself or an external surface of a predetermined layer or a film formed on the substrate.

In the present specification, the term "Me" indicates a methyl group, the term "Et" indicates an ethyl group, the term "Pr" indicates a propyl group, the term "nPr" indicates a normal propyl group or a linear propyl group, the term "iPr" indicates an isopropyl group, the term "Bu" indicates a butyl group, the term "nBu" indicates a normal butyl group or a linear butyl group, the term "tBu" indicates a tert-butyl group (1,1-dimethyl ethyl group), the term "sBu" indicates a sec-butyl group (1-methyl propyl group), and the term "iBu" indicates an iso-butyl group (2-methyl propyl group).

The term "room temperature" used herein may denote a temperature in a range of about 20° C. to about 28° C., e.g., it may vary according to seasons.

A lanthanum compound according to an embodiment may have an amidinate ligand. In an implementation, at least one of two nitrogen atoms that constitute the amidinate ligand may have a branch type structure.

The lanthanum compound according to an embodiment may be represented by Formula 1.

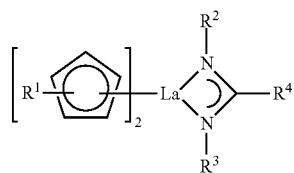

[Formula 1]

In Formula 1, $R^1$ may be, e.g., a hydrogen atom or a C1-C4 linear or branched alkyl group. $R^2$ and $R^3$ may each independently be, e.g., a hydrogen atom or a C1-C5 linear or branched alkyl group. In an implementation, at least one of $R^2$ and $R^3$ may be, e.g., a C3-C5 branched alkyl group. $R^4$ may be, e.g., a hydrogen atom or a C1-C4 linear or branched alkyl group.

In an implementation, the lanthanum compound of Formula 1 may be an asymmetrical amidinate, e.g., in which $R^2$ and $R^3$ are substituents having different structures from each other (e.g., are different substituents). For example, one of $R^2$ and $R^3$ may be a C3-C5 branched alkyl group, and the other one may be a C1-C5 linear alkyl group. In an implementation, one of $R^2$ and $R^3$ may be an iPr group, an iBu group, a tBu group, or an sBu group, and the other one of $R^2$ and $R^3$ may be a Me group, an Et group, an nPr group, or an nBu group. In an implementation, $R^1$ may be a hydrogen atom or a Me group, an Et group, an nPr group, or an iPr group. $R^4$ may be a Me group, an Et group, an nPr group, or an iPr group.

In an implementation, the lanthanum compound of Formula 1 may have a structure represented by one of Chemical Formulae 1 to 4.

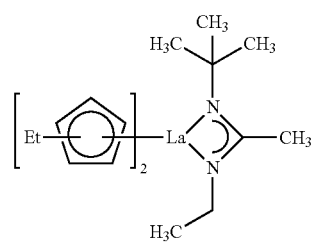

[Chemical Formula 1]

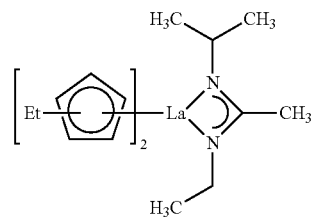

[Chemical Formula 2]

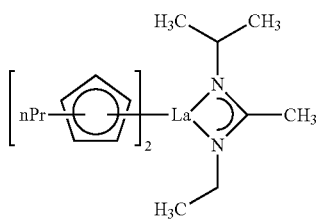

[Chemical Formula 3]

[Chemical Formula 4]

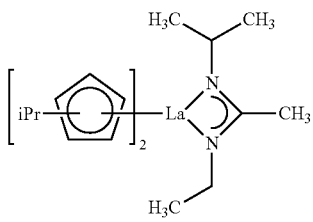

The lanthanum compound of Formula 1 (e.g., including an asymmetrical amidinate in which $R^2$ and $R^3$ are substituents having different structures) may be able to react at a relatively low temperature. For example, a lanthanum-containing film may be readily manufactured at a low temperature. In an implementation, the lanthanum compound of Formula 1 (e.g., including an asymmetrical amidinate) may have excellent surface adsorption properties. For example, the lanthanum compound may be advantageously used in an atomic layer deposition (ALD) process.

In synthesizing the lanthanum compound of Formula 1, when the lanthanum compound including an asymmetrical amidinate (e.g., in which $R^2$ and $R^3$ are substituents having different structures) is synthesized, thermal stability of the lanthanum compound may be increased in a process of synthesizing the lanthanum compound, and also, an La precursor, which is in a liquid state at room temperature (at atmospheric pressure), may be obtained since a melting point of the lanthanum compound is lowered.

In an implementation, one of the $R^2$ and $R^3$, which are functional groups of the amidinate ligand, e.g., $R^2$, may be a bulky-type branched functional group having a three-dimensional obstacle greater than the other one of $R^2$ and $R^3$, e.g., $R^3$, and $R^3$ may be a linear alkyl group. For example, the polarity of the lanthanum compound of Formula 1 may be increased, and as a result, an adsorption characteristic at a surface of a substrate of the lanthanum compound may be increased. In this manner, when the surface adsorption characteristic of the lanthanum compound is increased, molecules of the lanthanum compound may show a self-limiting growth behavior, and an ALD deposition characteristic may be greatly increased. In an implementation, the bulky-type branched functional group that constitutes one of the functional groups, e.g., $R^2$ and $R^3$ of the amidinate ligand, may help block attraction between adjacent molecules, and a linear alkyl chain that constitutes the other one of $R^2$ and $R^3$ may perform rotational and flexibility motions, and a melting point of the lanthanum compound may be greatly reduced. For example, the lanthanum compound may be in a liquid state at room temperature.

In an implementation, the lanthanum compound (e.g., including an asymmetrical amidinate in which $R^2$ and $R^3$ are substituents having different structures) may readily react with various reactive gases, e.g., $O_3$ or $NH_3$, at a relatively lower temperature than other La precursors, the ALD characteristic at a relatively low temperature may be increased.

In the lanthanum compound of Formula 1, a structure including the asymmetrical amidinate (e.g., in which $R^2$ and $R^3$ are substituents having different structures) may be formed as follows.

First, a lanthanum tris[bis(trialkylsilyl)amide] complex may be formed by reacting a lanthanum halide with a bis(trialkylsilyl)amide alkali metal salt. The lanthanum halide may be $LaCl_3$.

Reaction Scheme 1 shows a process of forming the lanthanum tris[bis(trialkylsilyl)amide] complex A-1.

[Reaction Scheme 1]

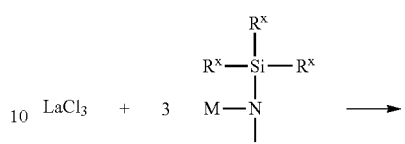

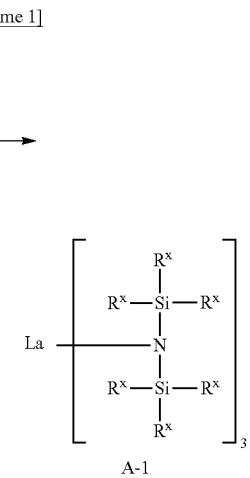

In Reaction Scheme 1, M indicates an alkali metal, and $R^X$ indicates a C1-C2 alkyl group. In an implementation, M may be sodium (Na), lithium (Li), or potassium (K).

As shown in Reaction Scheme 1, after reacting $LaCl_3$ as a lanthanum halide with bis(trialkylsilyl)amide alkali metal salt and recrystallizing it, a lanthanum tris[bis(trialkylsilyl)amide] complex A-1 may be formed.

As shown in Reaction Scheme 2 below, a Si-containing intermediate A-2 may be formed by causing a reaction between the lanthanum tris[bis(trialkylsilyl)amide] complex A-1 and alkylcyclopentadiene.

[Reaction Scheme 2]

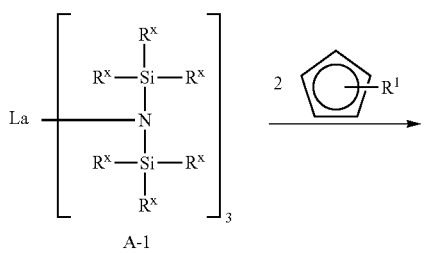

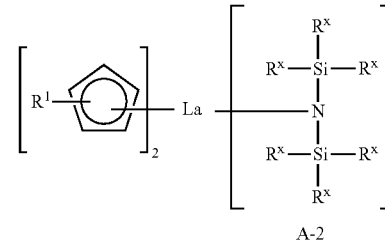

In Reaction Scheme 2, $R^1$ may be defined the same as $R^1$ of Formula 1.

The Si-containing intermediate A-2 may be purified by distillation.

As shown in Reaction Scheme 3, below, the lanthanum compound (e.g., including an asymmetrical amidinate) of Formula 1 may be formed by causing a reaction between the Si-containing intermediate A-2 and a bisalkylamidine compound.

[Reaction Scheme 3]

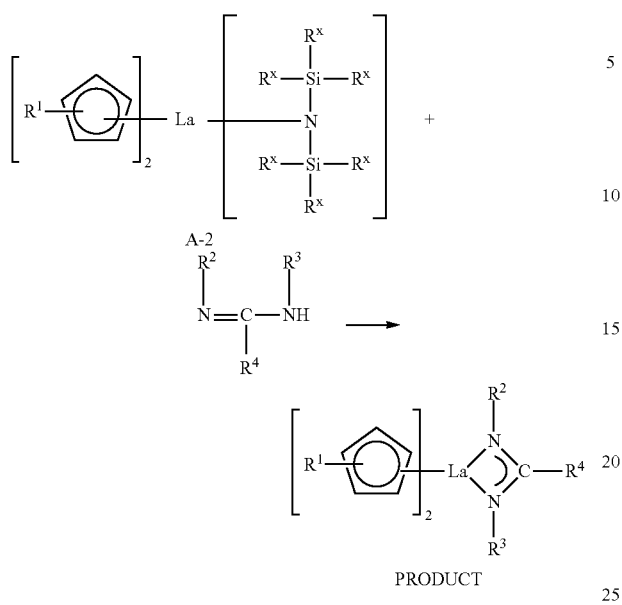

PRODUCT

In Reaction Scheme 3, $R^1$, $R^2$, $R^3$, and $R^4$ may be defined the same as those of Formula 1, and $R^2$ and $R^3$ may be substituents having different structures from each other.

For example, in Reaction Scheme 3, N'-ethyl-N-isopropyl acetimidamide of Chemical Formula 5 as the bisalkylamidine compound may be used.

[Chemical Formula 5]

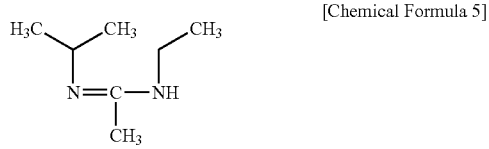

An example method of manufacturing the N'-ethyl-N-isopropyl acetimidamide in Chemical Formula 5 will be described in a synthetic example (1) below.

As shown in Reaction Scheme 3, by reacting the Si-containing intermediate A-2 with the bisalkylamidine compound and distilling a resultant product, the lanthanum compound (PRODUCT) (e.g., including an asymmetrical amidinate) of Formula 1 may be obtained.

In an implementation, in the lanthanum compound (PRODUCT) of Formula 1, $R^2$ and $R^3$ may each independently be, e.g., a C3-C5 branched alkyl group, and $R^4$ may be, e.g., a C2-C4 linear or branched alkyl group. In an implementation, $R^2$ and $R^3$ may each independently be, e.g., an iPr group, an iBu group, a tBu group, or an sBu group. In an implementation, $R^2$ and $R^3$ may each independently be, e.g., branched alkyl groups and may have the same structure. In an implementation, $R^1$ may be, e.g., a hydrogen atom, a Me group, an Et group, an nPr group, or an iPr group. In an implementation, $R^4$ may be a Me group, an Et group, an nPr group, or an iPr group.

In an implementation, the lanthanum compound of Formula 1 may have a structure represented by one of Chemical Formulae 6 to 10.

[Chemical Formula 6]

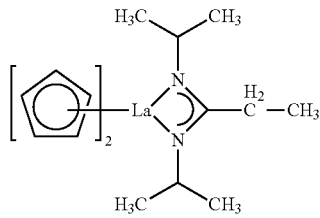

[Chemical Formula 7]

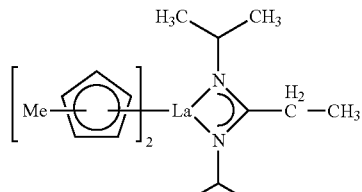

[Chemical Formula 8]

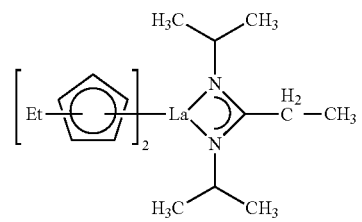

[Chemical Formula 9]

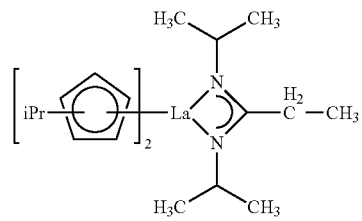

[Chemical Formula 10]

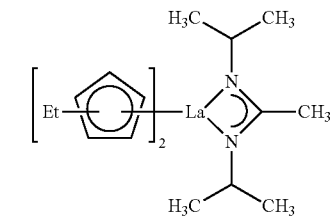

In order to manufacture a compound having the structures of Chemical Formulae 6 to 10, a method similar to the method described with reference to Reaction Schemes 1 through 3 may be used. In an implementation, in Reaction Scheme 3, diisopropyl acetamidine may be used as the bisalkylamidine compound.

The lanthanum compound according to embodiments may be in a liquid state at room temperature. For example, when the lanthanum compound is used as a source in a process of manufacturing an integrated circuit device, a central supply is possible in a manufacturing facility. Therefore, it may not be necessary to stop the production facility for changing the source. Accordingly, a loss due to stopping the production facility may be reduced, and also, it is possible to check a remaining amount of the lanthanum compound source. Also, the lanthanum compound according to embodiments may be appropriate for use as a lanthanum precursor when a film is formed by using a deposition process, e.g., an ALD process or a chemical vapor deposition (CVD) process including a vaporization process. The lanthanum compound according to embodiments may have a high reactivity with a reactive gas, e.g., $O_3$, and may be appropriate for use as a lanthanum precursor used particularly in an ALD process.

The lanthanum compound according to embodiments may be vaporized by using a bubbler or a vaporizer. For example, a process time of the lanthanum compound may be reduced, a process reproducibility may be high since there is no change in a deposition speed in a large production system, and it may be advantageous for maintaining a process distribution and for improving process defect.

The lanthanum compound according to embodiments may have excellent ALD deposition characteristics, and a step-coverage of approximately 95% or greater may be obtained in a complicated and fine three-dimensional (3D) structure such as a Fin Field Effect Transistor (FinFET) structure. A lanthanum containing film having very low impurity content (e.g., of approximately 5% or less) may be formed by using the lanthanum compound according to embodiments. Accordingly, the lanthanum compound according to embodiments may be very useful for forming a thin film in a next generation integrated circuit.

The lanthanum compound according to embodiments may be used as a source material of a lanthanum precursor composition for forming a lanthanum containing film for configuring an integrated circuit or for a manufacturing process of the integrated circuit.

FIG. 1 illustrates a flowchart of a method of forming a thin film, according to embodiments.

Referring to FIG. 1, in operation P20, a substrate may be prepared. The substrate may have the same configuration as a substrate 302 which will be described below with reference to FIG. 15.

In operation P30 of FIG. 1, a lanthanum-containing film may be formed on the substrate by using a lanthanum compound that is a liquid at room temperature.

The lanthanum compound may have the structure of Formula 1.

In an implementation, the lanthanum compound may include an asymmetrical amidinate in which $R^2$ and $R^3$ are substituents having different structures. For example, one of $R^2$ and $R^3$ may be a C3-C5 branched alkyl group, and the other one may be a C1-C5 linear alkyl group. For example, one of $R^2$ and $R^3$ may be an iPr group, an iBu group, a tBu group, or an sBu group, and the other one of $R^2$ and $R^3$ may be a Me group, an Et group, an nPr group, or an nBu group. $R^1$ may be a Me group, an Et group, an nPr group, or an iPr group. $R^4$ may be a Me group, an Et group, an nPr group, or an iPr group. For example, the lanthanum compound may have a structure of one of Chemical Formulae 1 through 4.

In an implementation, in the lanthanum compound, $R^2$ and $R^3$ may each independently be, e.g., a C3-C5 branched alkyl group, and $R^4$ may be, e.g., a C2-C4 linear or branched alkyl group. For example, $R^2$ and $R^3$ may each independently be an iPr group, an iBu group, a tBu group, or an sBu group. For example, $R^1$ may be a hydrogen atom, a Me group, an Et group, an nPr group, or an iPr group. $R^4$ may be a Me group, an Et group, an nPr group, or an iPr group. For example, the lanthanum compound may have a structure represented by one of Chemical Formulae 6 to 10.

In the method of forming a thin film according to an embodiment, after forming a lanthanum containing film by using the lanthanum compound of Formula 1, the method may further include an annealing process under an inert atmosphere, an oxidation atmosphere, or a reduction atmosphere. Also, in order to remove a step difference formed on a surface of the lanthanum containing film, if desired, a reflow process may be performed on the lanthanum containing film. In an implementation, the annealing process and the reflow process may be respectively performed at a temperature condition selected in a range of about 250° C. to about 1,000° C., e.g., in a range of about 300° C. to about 500° C.

In the method of forming a thin film according to an embodiment, a lanthanum containing film of a desired kind, e.g., a metal, oxide ceramic, nitride ceramic, or glass, may be formed by appropriately selecting the lanthanum compound of Formula 1, a different precursor used together with the lanthanum compound of Formula 1, a reactive gas, and a process condition for forming a thin film. In an implementation, the lanthanum containing film formed according to the method of forming a thin film may include, e.g., a $La_2O_3$ film; a LaON film; a La—Ti compound oxide thin film (LaTiO thin film); a La—Ti compound oxynitride thin film (LaTiON thin film); a La—Al compound oxide thin film (LaAlO thin film); a La—Al—Si compound oxide thin film; a La—Zr—Hf compound oxide thin film; an La—Si—Zr—Hf compound oxide thin film; a La—Ta—Nb compound oxide thin film; a La—Si—Ta—Nb compound oxide thin film; a La-doped ferroelectric compound oxide thin film (for example, a compound oxide thin film including La-doped lead titanate, La-doped lead titanate zirconate, La-doped titanate bismuth, or a material that further additionally includes Si in the above compositions); a silica based glass thin film obtained from at least one selected from a La-doped silicon oxide thin film, a La-doped aluminum oxide, a La-doped germanium oxide, and a La-doped titanium compound; a glass thin film including at least one fluoride selected from a La-doped zirconium fluoride, La-doped barium fluoride, La-doped aluminum fluoride, and La-doped sodium fluoride; a La-doped tellurite glass thin film; a boron glass thin film; a chalcogenide glass thin film; a sulfide glass thin film; a bismuth glass thin film; a phosphate silicate glass thin film; a boron silicate glass thin film; or a combination of these materials.

In operation P30 of FIG. 1, in order to form a lanthanum containing film, an ALD process or a CVD process may be used.

Figure 2:
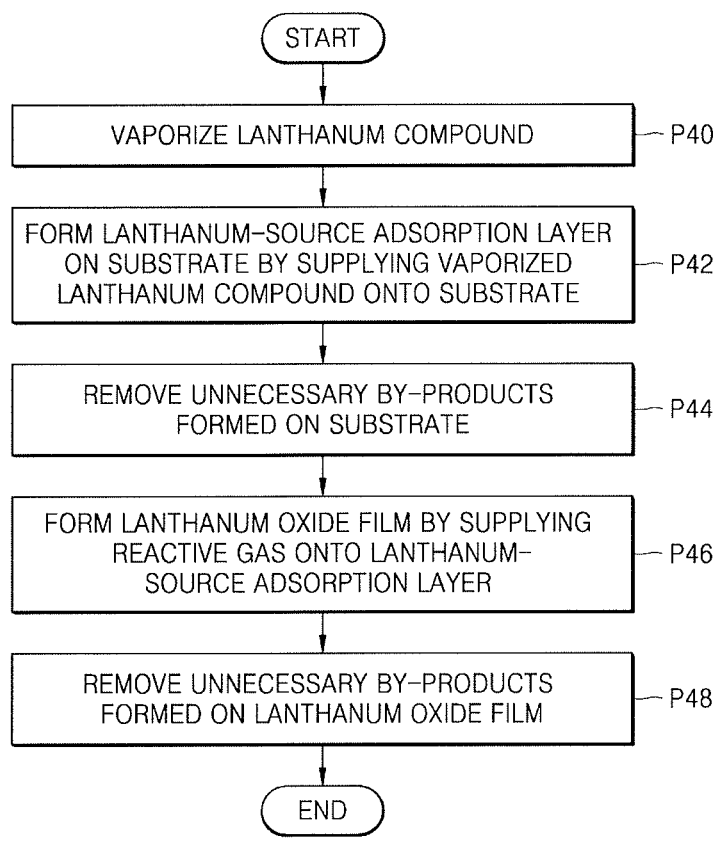
FIG. 2 illustrates a flowchart of a method of forming a lanthanum oxide film, according to embodiments.

FIG. 2 illustrates a flowchart of a method of forming a lanthanum oxide film according to embodiments by using an ALD process when the lanthanum oxide film as the lanthanum containing film is formed according to operation P30 of FIG. 1.

Referring to FIG. 2, in operation P40, the lanthanum compound may be vaporized. The lanthanum compound may have a structure of Formula 1.

In an implementation, the lanthanum compound may include an asymmetrical amidinate in which $R^2$ and $R^3$ are substituents having different structures. For example, one of $R^2$ and $R^3$ is a C3-C5 branched alkyl group and the other one of the $R^2$ and $R^3$ is a C1-C5 linear alkyl group. For example, one of the $R^2$ and $R^3$ may be an iPr group, an iBu group, a tBu group, or an sBu group, and the other one of the $R^2$ and $R^3$ may be a Me group, an Et group, an nPr group, or an nBu group. In an implementation, $R^1$ may be a hydrogen atom or a Me group, an Et group, an nPr group, or an iPr group. $R^4$ may be a Me group, an Et group, an nPr group, or an iPr group. In an implementation, the lanthanum compound may have a structure of one of the structures of Chemical Formulae 1 to 4.

In an implementation, in the lanthanum compound, $R^2$ and $R^3$ may each independently be C3-C5 branched alkyl groups, and $R^4$ may be a C2-C4 linear or branched alkyl group. In an implementation, the $R^2$ and $R^3$ may each independently be iPr groups, iBu groups, tBu groups, or sBu groups. In an implementation, $R^1$ may be a hydrogen atom, a Me group, an Et group, an nPr group, or an iPr group. The $R^4$ may be a Me group, an Et group, an nPr group, or an iPr group. For example, the lanthanum compound may have a structure of one of the structures of Chemical Formulae 6 to 10.

In operation P42, a La source adsorption layer may be formed on the substrate by supplying the lanthanum compound vaporized according to operation P40.

The substrate may have a structure of a substrate 302 which will be described below with reference to FIG. 15.

The La source adsorption layer including a chemisorbed layer and a physisorbed layer may be formed on the substrate by supplying the vaporized lanthanum compound onto the substrate.

While the La source adsorption layer is formed on the substrate according to operation P42, heat may be applied to the substrate by heating the substrate or heating a reaction chamber, e.g., a reaction chamber 254 which will be described below with reference to FIGS. 3 through 6. The La source adsorption layer may have a composition different from a lanthanum containing film which is a target product. A process for forming the La source adsorption layer may be performed at a temperature in a range of about room temperature to about 400° C., e.g., in a range of about 150° C. to about 375° C.

In an implementation, a process of heating the substrate on which the La source adsorption layer is formed or a process of heat treating the reaction chamber in which the substrate is accommodated may further be performed. The heat treatment may be performed in a range of room temperature to about 500° C., e.g., in a range of about 150° C. to about 500° C.

In operation P44, unnecessary by-products on the substrate may be removed.

In an implementation, the unnecessary by-products may be removed by supplying a purge gas onto the substrate. The purge gas may be, e.g., an inert gas, such as Ar gas, He gas, or Ne gas or $N_2$ gas.

In an implementation, in order to remove the unnecessary by-products, a pressure of an inside of a reaction chamber, in which the substrate is loaded, e.g., the reaction chamber 254 which will be described below with reference to FIGS. 3 through 6 may be reduced. In order to reduce the pressure of the reaction chamber, a pressure in a range of about 0.01 kPa to about 50 kPa, e.g., in a range of about 0.1 kPa to about 5 kPa may be applied.

In operation P46, a lanthanum oxide film may be formed by supplying a reactive gas onto the La source adsorption layer formed on the substrate.

The reactive gas may include, e.g., $O_2$, $O_3$, plasma $O_2$, $H_2O$, $NO_2$, NO, $CO_2$, $H_2O_2$ or a combination of these gases.

In an implementation, heat may be applied to the substrate while a reactive gas is supplied onto the La source adsorption layer. In this case, in order to apply heat to the substrate, a temperature atmosphere in a range of room temperature to about 400° C., e.g., in a range of about 150° C. to about 375° C. may be maintained.

In operation P48, unnecessary by-products on the lanthanum oxide film may be removed.

The process of removing the unnecessary by-products may be performed as the same method described in operation P44.

In the method of forming a thin film according to an embodiment, a series of operations from P40 to P48 illustrated in FIG. 2 may be considered as one-cycle, and the cycle may be repeated a plurality of times until the lanthanum oxide film having a desired thickness is obtained.

In forming of the lanthanum oxide film according to the method of forming a thin film, plasma energy, light, or a voltage may further be applied. There is no specific time limitation in applying the energy. For example, an energy applying process may further be included when at least one of operation P42, operation P44, operation P46, and operation P48 is performed or between each of operations P42, P44, P46, and P48.

After forming the lanthanum oxide film according to the method of forming a thin film, in order to obtain a further favorable electrical characteristic, a process of annealing the lanthanum oxide film under an inert gas atmosphere, an oxidizing atmosphere, or a reducing atmosphere may further be performed. In an implementation, to remove a step difference formed on a surface of the lanthanum oxide film, a reflow process may be performed on the lanthanum oxide film as desired. In an implementation, each of the annealing and the reflow process may be performed under a temperature condition selected in a range of about 250° C. to about 1,000° C., e.g., about 300° C. to about 500° C.

For example, in order to form the lanthanum oxide film on the substrate, the lanthanum compound of Formula 1 may be supplied onto the substrate together with or sequentially at least one of a different precursor, a reactive gas, a carrier gas, and a purge gas. Details of the different precursor, the reactive gas, the carrier gas, and the purge gas that may be supplied together with the lanthanum compound of Formula 1 are described below.

The lanthanum compound according to an embodiment may be used in a process of forming a thin film for manufacturing an integrated circuit device. For example, the lanthanum compound may be used as a La precursor in a process of forming a lanthanum containing film by using an ALD process or a CVD process.

FIGS. 3 through 6 respectively show schematic configurations of deposition devices 200A, 200B, 200C, and 200D as examples that may be used in a process of forming a thin film according to embodiments.

The deposition devices 200A, 200B, 200C, and 200D shown in FIGS. 3 to 6 respectively may include a fluid transmission unit 210, a thin-film formation unit 250 configured to perform a deposition process of forming a thin film on a substrate W using a process gas supplied from a source container 212 included in the fluid transmission unit 210, and an exhaust system 270 configured to exhaust gases or by-products, which may remain in the thin-film formation unit 250 after causing a reaction.

The thin-film formation unit 250 may include a reaction chamber 254 including a susceptor 252 configured to support the substrate W. A shower head 256 may be installed at a top end unit of the inside of the reaction chamber 254. The shower head 256 may be configured to supply a gas supplied from the fluid transmission unit 210 onto the substrate W.

The fluid transmission unit 210 may include an inlet line 222 configured to supply a carrier gas to the source container 212 from the outside and an outlet line 224 configured to supply a source compound contained in the source container 212 to the thin-film formation unit 250. A valve V1 and a mass flow controller (MFC) M1 may be installed at the inlet line 222, and a valve V2 and an MFC M2 may be installed at the outlet line 224. The inlet line 222 and the outlet line 224 may be connected to each other through a bypass line 226. A valve V3 may be installed at the bypass line 226. The valve V3 may operate due to a pneumatic pressure by using an electric motor or another remote control method.

The source compound supplied from the source container 212 may be supplied into the reaction chamber 254 through an inlet line 266 of the thin-film formation unit 250, which is connected to the outlet line 224 of the fluid transmission unit 210. If necessary, the source compound supplied from the source container 212 may be supplied into the reaction chamber 254 together with a carrier gas supplied through an inlet line 268. A valve V4 and an MFC M3 may be installed at the inlet line 268 through which the carrier gas is supplied.

The thin-film formation unit 250 may include an inlet line 262 configured to supply a purge gas into the reaction chamber 254 and an inlet line 264 configured to supply a reactive gas. A valve V5 and an MFC M4 may be installed at the inlet line 262, and a valve V6 and an MFC M5 may be installed at the inlet line 264.

The process gas used in the reaction chamber 254 and reaction by-products to be discarded may be exhausted to the outside through the exhaust system 270. The exhaust system 270 may include an exhaust line 272 connected to the reaction chamber 254 and a vacuum pump 274 installed at the exhaust line 272. The vacuum pump 274 may perform a function of eliminating the process gas and the reaction by-products, which are exhausted from the reaction chamber 254.

A trap 276 may be installed in the exhaust line 272 at an upstream side of the vacuum pump 274. The trap 276 may trap, for example, reaction by-products generated by unreacted process gases in the reaction chamber 254 to prevent the reaction by-products from flowing into the vacuum pump 274 installed at a downstream side.

In the method of forming a thin film according to an embodiment, the lanthanum compound of Formula 1 may be used as a source compound.

In an implementation, the lanthanum compound may include an asymmetrical amidinate in which $R^2$ and $R^3$ are substituents having different structures. For example, one of the $R^2$ and $R^3$ may be a C3-C5 branched alkyl group, and the other one of the $R^2$ and $R^3$ may be a C1-C5 linear alkyl group. For example, one of the $R^2$ and $R^3$ may be an iPr group, an iBu group, a tBu group, or an sBu group, and the other one of the $R^2$ and $R^3$ may be a Me group, an Et group, an nPr group, or an nBu group. In an implementation, $R^1$ may be a hydrogen atom or a Me group, an Et group, an nPr group, or an iPr group. $R^4$ may be a Me group, an Et group, an nPr group, or an iPr group. For example, the lanthanum compound may have a structure represented by one of Chemical Formulae 1 through 4.

In an implementation, in the lanthanum compound, the $R^2$ and $R^3$ may each independently be a C3-C5 branched alkyl group, and $R^4$ may be a C2-C4 linear or branched alkyl group. In an implementation, the $R^2$ and $R^3$ may each independently be an iPr group, an iBu group, a tBu group, or an sBu group. In an implementation, the $R^1$ may be a hydrogen atom or a Me group, an Et group, an nPr group, or an iPr group. The $R^4$ may be a Me group, an Et group, an nPr group, or an iPr group. The lanthanum compound may have a structure represented by one of Chemical Formulae 6 to 10.

In an implementation, the lanthanum compound according to the embodiment may be in a liquid state at room temperature, and may be highly reactive with other process gases, e.g., a reactive gas, such as a reducing gas. Accordingly, the trap 276 installed at the exhaust line 272 may trap attachments, such as reaction by-products which may be generated due to a reaction between the process gases to prevent the attachments from flowing to a downstream side of the trap 276. The trap 276 may have a configuration to be cooled by a cooler or a water cooling device.

Also, a bypass line 278 and an automatic pressure controller (APC) 280 may be installed in the exhaust line 272 at an upstream side of the trap 276. Valves V7 and V8 may be respectively installed in the bypass line 278 and a portion of the exhaust line 272 extending parallel to the bypass line 278.

Figure 3:
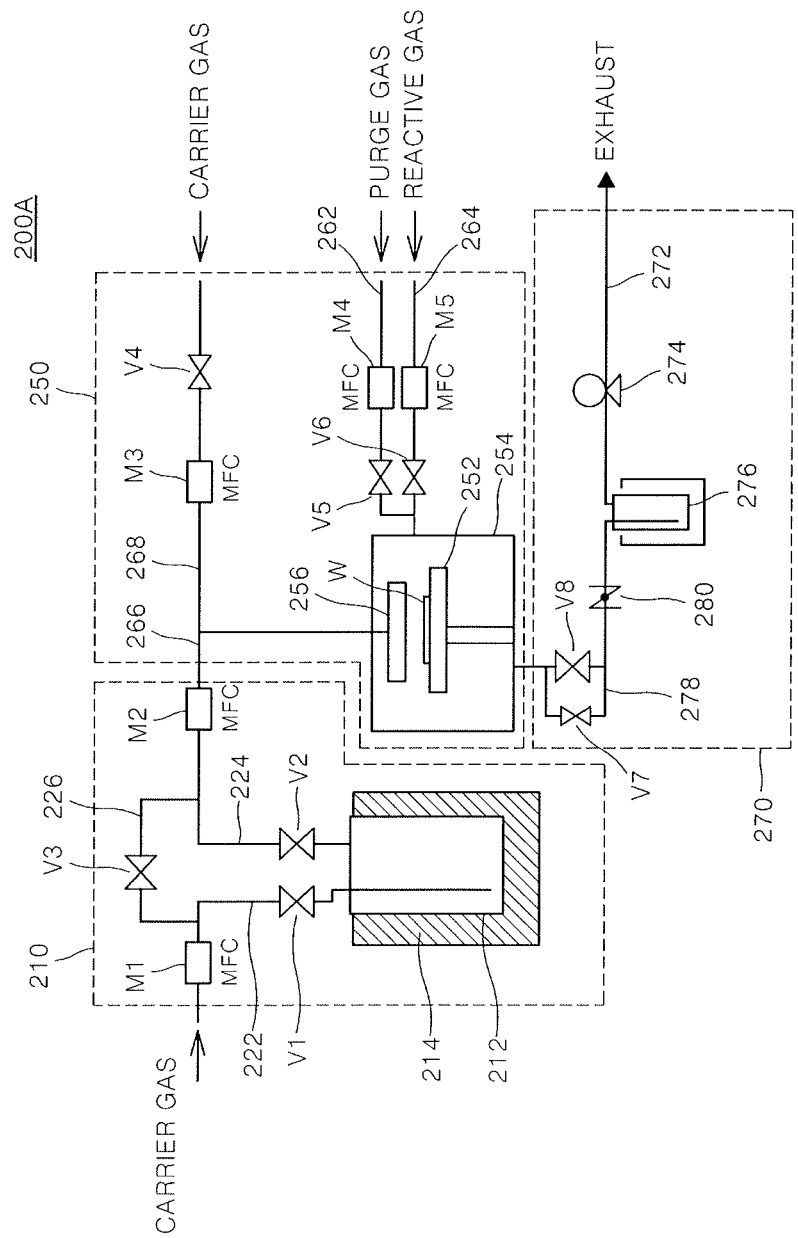
FIGS. 3 through 6 illustrate schematic configurations of example deposition devices that may be used in a process of forming a thin film according to embodiments.
Figure 5:
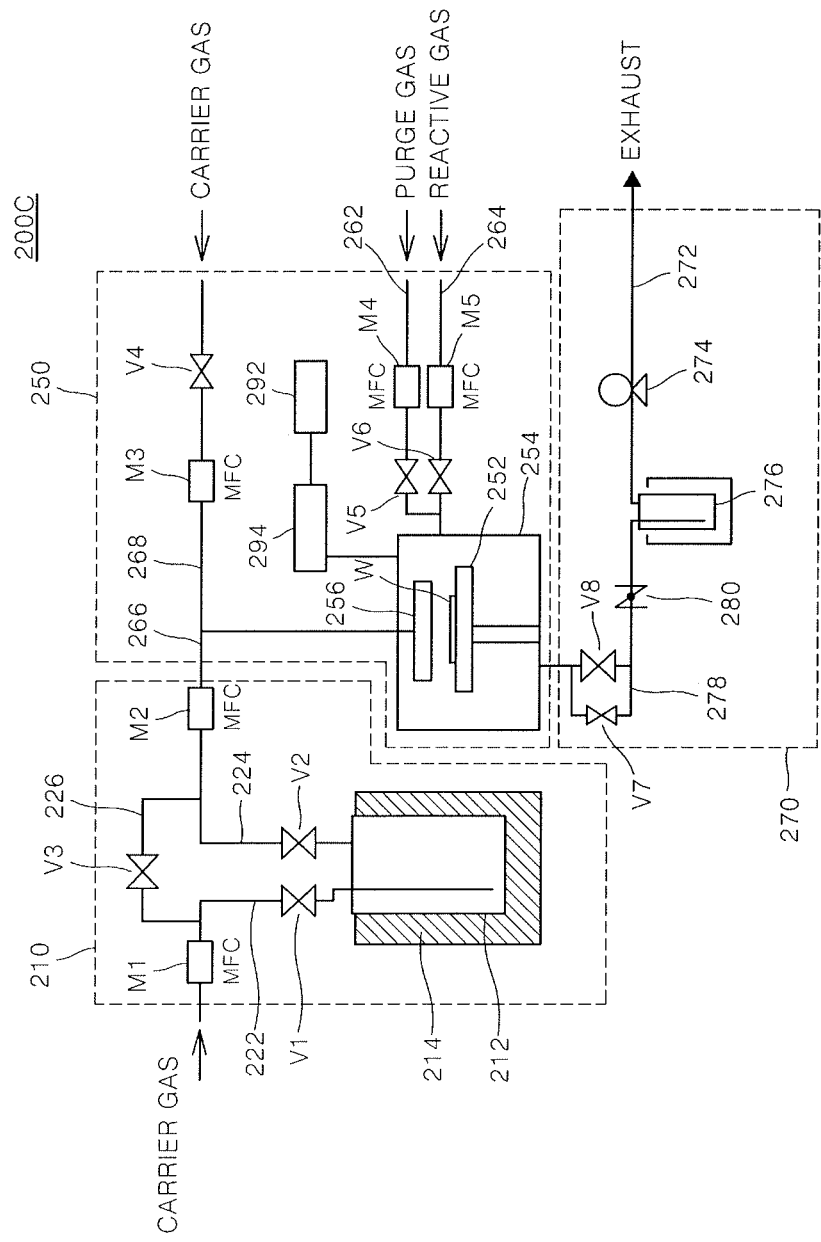

As in the deposition devices 200A and 200C shown in FIGS. 3 and 5, a heater 214 may be installed in the source container 212. A source compound contained in the source container 212 may be maintained at a relatively high temperature by the heater 214.

Figure 4:
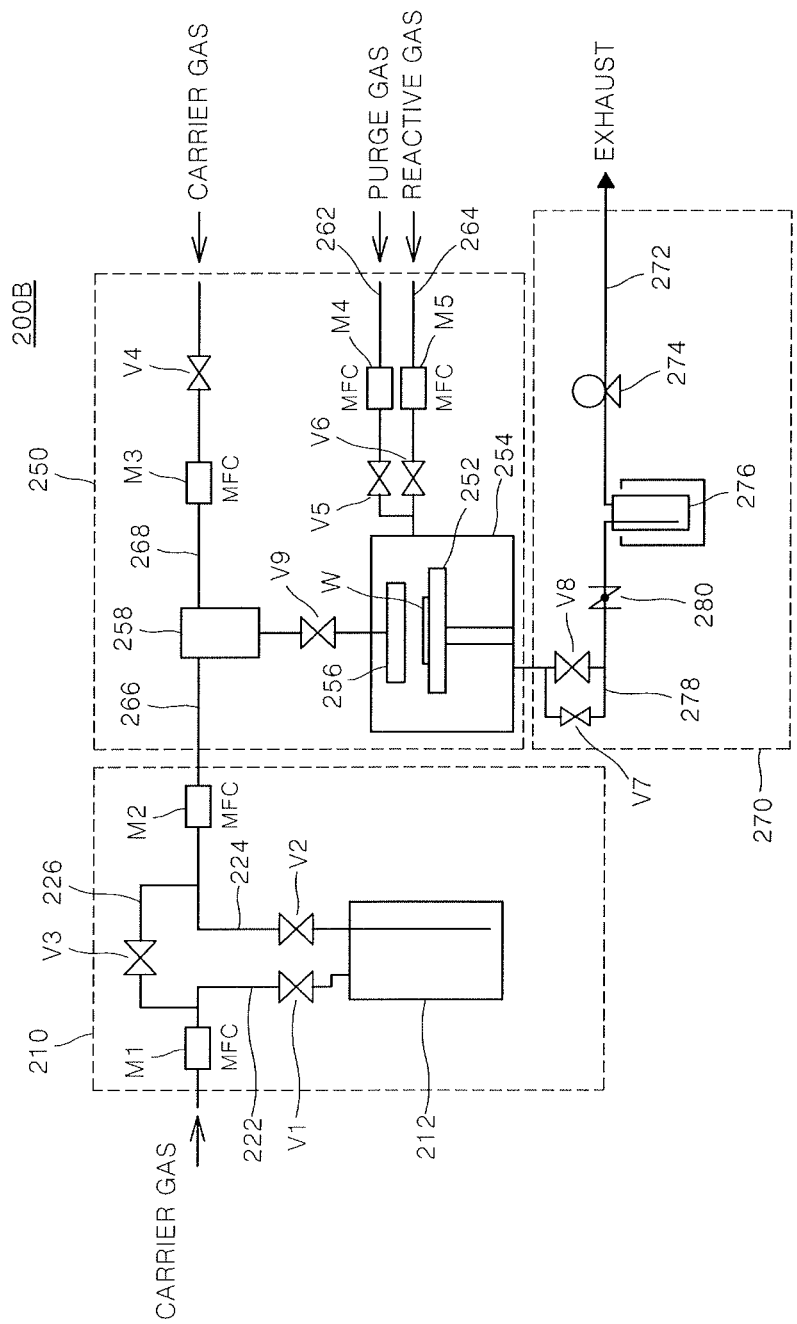
Figure 6:
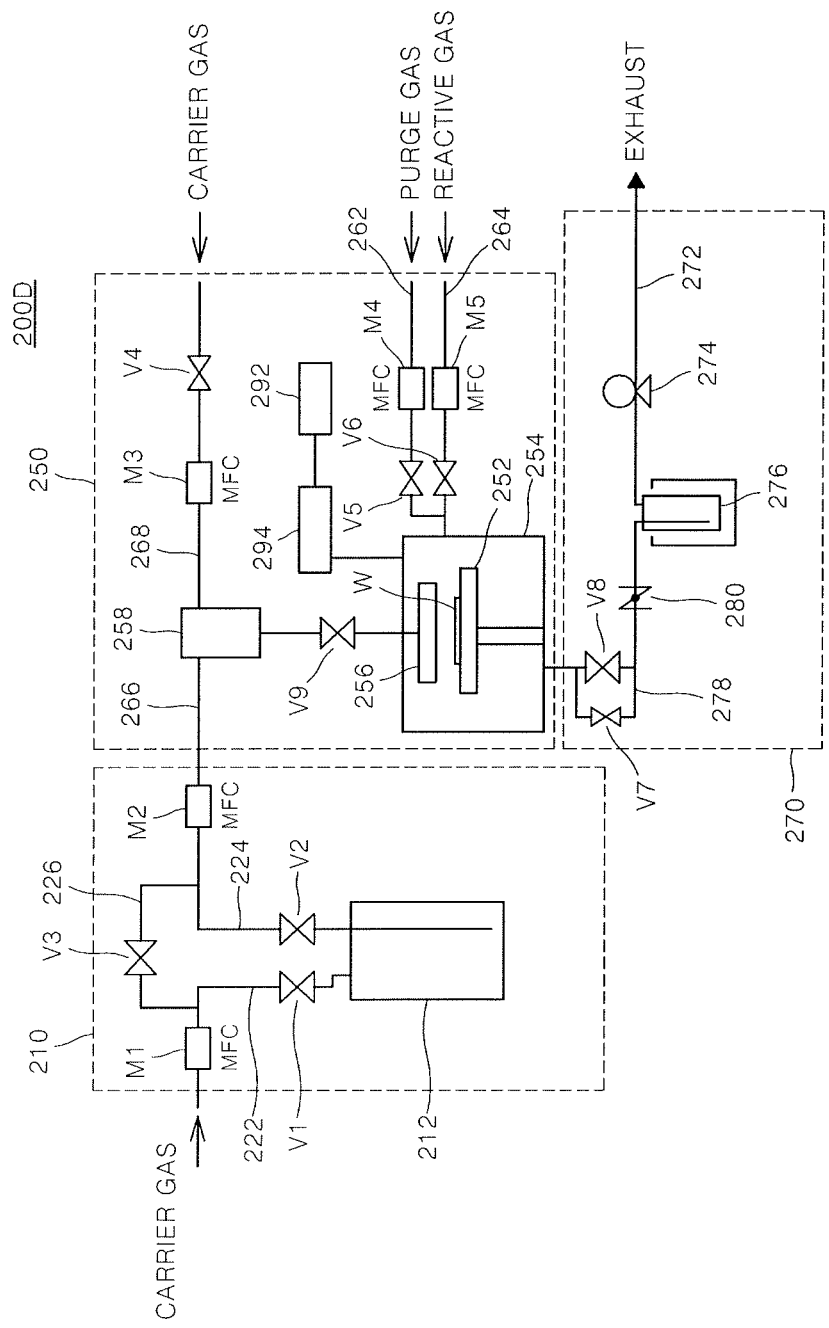

As in the deposition devices 200B and 200D shown in FIGS. 4 and 6, a vaporizer 258 may be installed at the inlet line 266 of the thin-film formation unit 250. The vaporizer 258 may vaporize a fluid supplied in a liquid state from the fluid transmission unit 210 and may supply the vaporized source compound into the reaction chamber 254. The source compound vaporized by the vaporizer 258 may be supplied to the reaction chamber 254 together with a carrier gas supplied through the inlet line 268. The supplying of the source compound into the reaction chamber 254 through the vaporizer 258 may be controlled by a valve V9.

Also, as in the deposition devices 200C and 200D shown in FIGS. 5 and 6, in order to generate plasma in the reaction chamber 254, the thin-film formation unit 250 may include a radio-frequency (RF) power source 292 and an RF matching system 294, which are connected to the reaction chamber 254.

In the deposition devices 200A, 200B, 200C, and 200D shown in FIGS. 3 to 6, one source container 212 is connected to the reaction chamber 254 as examples. If desired, a plurality of source containers 212 may be provided in the fluid transmission unit 210, and each of the source containers 212 may be connected to the reaction chamber 254.

In operation P40 of FIG. 2, the lanthanum compound may be vaporized by using the vaporizer 258 of any one of the deposition devices 200B and 200D shown in FIGS. 4 and 6.

Also, in the method of forming the thin film according to the embodiment, any one of the deposition devices 200A, 200B, 200C, and 200D shown in FIGS. 3 to 6 may be used to form the lanthanum-containing film on the substrate W.

When performing the process of forming the lanthanum-containing film described with reference to FIG. 1 or the process for forming the lanthanum oxide film described with reference to FIG. 2, the lanthanum compound of Formula 1 may be transported by using various methods and supplied into a reaction chamber of a thin film forming device, e.g., the reaction chamber 254 of each of the deposition devices 200A, 200B, 200C, and 200D shown in FIGS. 3 to 6.

In an implementation, to form a thin film on the substrate W via a CVD process by using the lanthanum compound of Formula 1, a gas transporting method may be used. The gas transporting method may include vaporizing the lanthanum compound of Formula 1 in the source container 212 by applying heat and/or reducing pressure, and supplying the vaporized lanthanum compound together with a carrier gas (e.g., Ar, $N_2$, and He) into the reaction chamber 254 as desired.

In an implementation, in order to form a thin film via a CVD process by using the lanthanum compound of Formula 1, a liquid transporting method may be used. The liquid transporting method may include transporting the lanthanum compound in a liquid state or a solution state to the vaporizer 258, vaporizing the lanthanum compound of Formula 1 in the vaporizer 258 by applying heat and/or reducing a pressure, and supplying the vaporized lanthanum compound into the reaction chamber 254. When the liquid transporting method is used, the lanthanum compound according to the embodiment itself or a solution in which the lanthanum compound is dissolved in an organic solvent may be used as a source compound for forming a thin film in the CVD process.

In an implementation, a multi-component CVD process may be used to form a lanthanum-containing film in the method of forming the thin film according to the embodiment. The multi-component CVD process may be performed by using a method (hereinafter, referred to as a "single source method") of independently vaporizing and supplying respective components of a source compound to be used in a CVD process or a method (hereinafter, referred to as a "cocktail source method") of vaporizing and supplying a mixed source obtained by previously mixing multi-component sources in a desired composition. When the cocktail source method is used, a first mixture containing the lanthanum compound of Formula 1, a first mixed solution in which the first mixture is dissolved in an organic solvent, a second mixture containing the lanthanum compound of Formula 1 and other precursor, or a second mixed solution in which the second mixture is dissolved in an organic solvent may be used as a source compound for forming a thin film in a CVD process.

Suitable organic solvents may be used to obtain the first mixed solution or the second mixed solution. For example, the organic solvent may be acetate esters, such as ethyl acetate, n-butyl acetate, and methoxyethyl acetate; ethers, such as tetrahydrofuran, tetrahydropyran, ethylene glycol dimethyl ether, diethylene glycol dimethyl ether, triethylene glycol dimethyl ether, dibutyl ether, and dioxane; ketones, such as methyl butyl ketone, methyl isobutyl ketone, ethyl butyl ketone, dipropyl ketone, diisobutyl ketone, methyl amyl ketone, cyclohexanone, and methylcyclohexanone; hydrocarbons, such as hexane, cylclohexane, methylcyclohexane, dimethylcyclohexane, ethylcyclohexane, heptane, octane, toluene, and xylene; hydrocarbons having a cyano group, such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; pyridine; or lutidine. The organic solvents describe above may be used alone or in a mixture of at least two kinds of these materials depending on solubilities, process temperatures, boiling points, and ignition points of solutes. When the organic solvent is used, the total amount of the lanthanum compound of Formula 1 and other precursor may range from about 0.01 mol/L to about 2.0 mol/L, for example, about 0.05 mol/L to about 1.0 mol/L in the organic solvent.

In the method of forming the thin film according to the embodiment, when the multi-component CVD process is used to form the lanthanum-containing film, other suitable precursors may be used together with the lanthanum compound according to the embodiment.

In an implementation, other precursor that may be used in the method of forming a thin film according to the embodiment may include an organic coordination compound of at least one of an alcohol compound, a glycol compound, a β-diketone compound, a cyclopentadiene compound, and an organic amine compound, and any one selected from silicon and a metal. In an implementation, the metal may include, e.g., magnesium (Mg), calcium (Ca), strontium (Sr), barium (Ba), titanium (Ti), zirconium (Zr), hafnium (Hf), vanadium (V), niobium (Nb), tantalum (Ta), manganese (Mn), palladium (Pd), platinum (Pt), copper (Cu), silver (Ag), gold (Au), zinc (Zn), aluminum (Al), gallium (Ga), indium (In), germanium (Ge), tin (Sn), lead (Pb), antimony (Sb), bismuth (Bi), yttrium (Y), nickel (Ni), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), or ytterbium (Yb).

The alcohol compound that may be used as the organic ligand compound of the other precursor may be, e.g., alkyl-alcohols, such as methanol, ethanol, propanol, isopropyl alcohol, butanol, sec-butyl alcohol, isobutyl alcohol, tert-butyl alcohol, pentyl alcohol, isopentyl alcohol, and 3-pentyl alcohol; ether-alcohols, such as 2-methoxyethanol, 2-ethoxyethanol, 2-butoxyethanol, 2-(2-methoxyethoxy)ethanol, 2-methoxy-1-methylethanol, 2-methoxy-1,1-dimethylethanol, 2-ethoxy-1,1-dimethylethanol, 2-propoxy-1,1-diethylethanol, 2-butoxy-1,1-diethylethanol, 2-(2-methoxyethoxy)-1,1-dimethylethanol, 2-propoxy-1,1-diethylethanol, 2-s-butoxy-1,1-diethylethanol, and 3-methoxy-1,1-dimethylpropanol; and dialkyl amino alcohol.

The glycol compound that may be used as the organic ligand compound of the other precursor may be, e.g., 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, and 2,4-dimethyl-2,4-pentanediol.

The β-diketone compound that may be used as the organic ligand compound of the other precursor may be, e.g., alkyl-substituted (β-diketones, such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and 2,2-dimethyl-6-ethyldecane-3,5-dione; fluorine-substituted alkyl β-diketones, such as 1,1,1-trifluoropentane-2,4-dione, 1,1,1-trifluoro-5,5-dimethylhexane-2,4-dione, 1,1,1,5,5,5-hexafluoropentane-2,4-dione, and 1,3-diperfluorohexylpropane-1,3-dione; and ether-substituted β-diketones, such as 1,1,5,5-tetramethyl-1-methoxyhexane-2,4-dione, 2,2,6,6-tetramethyl-1-methoxyheptane-3,5-dione, and 2,2,6,6-tetramethyl-1-(2-methoxyethoxy)heptane-3,5-dione.

The cyclopentadiene compound that may be used as the organic ligand compound of the other precursor may be, e.g., cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclepentadiene, dimethylcyclopentadiene, or tetramethylcyclopentadiene.

The organic amine compound that may be used as the organic ligand compound of the other precursor may be, e.g., methylamine, ethylamine, propylamine, isopropylamine, dimethylamine, diethylamine, dipropylamine, diisopropylamine, ethylmethylamine, propylmethylamine, or isopropylmethylamine.

In the method of forming a thin film according to the embodiment, a vapor obtained by vaporizing the lanthanum compound of Formula 1 or a mixture of the lanthanum compound of Formula 1 and other precursor may be supplied onto a substrate together with a reactive gas that is used as needed. Thus, a lanthanum-containing film may be grown and deposited on the substrate by continuously decomposing and/or reacting precursors on the substrate in accordance with a CVD process.

In the method of forming a thin film according to the embodiment, a suitable method of transporting a source compound, a suitable deposition method, suitable synthesis conditions, and suitable synthesis equipment may be used.

The reactive gas that may be used in a method of forming a thin film according to the embodiment may include an oxidizing gas, a reducing gas, or a nitrogen-containing gas.

The oxidizing gas may include, e.g., oxygen, ozone, nitrogen dioxide, nitrogen monoxide, water vapor, hydrogen peroxide, a formic acid, a nitric acid, or an acetic acid.

The reducing gas may include, e.g., hydrogen, ammonia, or an organic metal compound.

The nitrogen-containing gas may include, e.g., an organic amine compound, such as monoalkylamine, dialkylamine, trialkylamine, and alkylenediamine, hydrazine, or ammonia.

In the method of forming the thin film according to the embodiment, a vapor transporting method, a liquid transporting method, a single source method, or a cocktail source method may be used to supply the source compound to the reaction chamber 254.

In the method of forming the thin film according to the embodiment, one of the following processes may be used to form the lanthanum-containing film. For example, the process includes: a thermal CVD process in which a thin film is formed by reacting the vaporized source compound or both the vaporized source compound and a reactive gas by heat; a plasma CVD process in which a thin film is formed by using heat and plasma; a photo-CVD process in which a thin film is formed by using heat and light; a photo-plasma CVD process in which a thin film is formed by using heat, light, and plasma, or an ALD process in which a thin film is deposited by stages on a molecular level.

In the method of forming the thin film according to the embodiment, thin film forming conditions for forming the lanthanum-containing film may include a reaction temperature (or substrate temperature), a reaction pressure, and a deposition speed.

The reaction temperature may be a temperature at which the lanthanum compound of Formula 1 may sufficiently react. In an implementation, the reaction temperature may be, e.g., a temperature of about 100° C. or higher. In an implementation, the reaction temperature may be, e.g., selected in the range of about 150° C. to about 500° C.

In an implementation, the reaction pressure may be selected in a range of an atmospheric pressure to about 10 Pa in a thermal CVD process or a photo-CVD process and may be selected in a range of about 10 Pa to about 2000 Pa in a plasma process.

Also, a deposition speed may be controlled by controlling supply conditions (e.g., a vaporization temperature and a vaporization pressure) of a source compound, a reaction temperature, and a reaction pressure. In the method of forming the thin film according to the embodiment, a deposition speed of the lanthanum-containing film may be selected in the range of about 0.01 nm/min to about 5000 nm/min, e.g., in a range of about 0.1 nm/min to about 1000 nm/min.

When the lanthanum-containing film is formed by using an ALD process, the number of cycles of ALD processes may be adjusted to control a thickness of the lanthanum-containing film.

When the lanthanum oxide film is formed by using the ALD process, energy (e.g., plasma, light, or a voltage) may be applied. Time points at which the energy is applied may be variously selected. For example, the energy (e.g., plasma, light, or a voltage) may be applied: at a time point when a source gas containing the lanthanum compound is introduced into the reaction chamber 254; a time point when the source gas is adsorbed on the substrate; at a time when an exhaust process is performed by using a purge gas; a time point when a reactive gas is introduced into the reaction chamber 254; or between the respective time points.

A lanthanum-containing film formed by using the method of forming the thin film according to the embodiment may be used for various purposes. For example, the lanthanum-containing film may be used for a gate dielectric film of a transistor, a conductive barrier film used for interconnections, a resistive film, a magnetic film, a barrier metal film for liquid crystals, a member for thin film solar cells, a member for semiconductor equipment, a nanostructure, a hydrogen storage alloy, a microelectromechanical systems (MEMS) device, or an actuator.

Hereinafter, synthesis examples and estimation examples of the lanthanum compound according to the embodiment will be described.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis Example 1

Synthesis of an Intermediate Compound (N'-ethyl-N-isopropyl acetimidamide) Expressed as Chemical Formula 5

A synthesis process of the intermediate compound expressed as Chemical Formula 5 is schematically shown in Reaction Scheme 4.

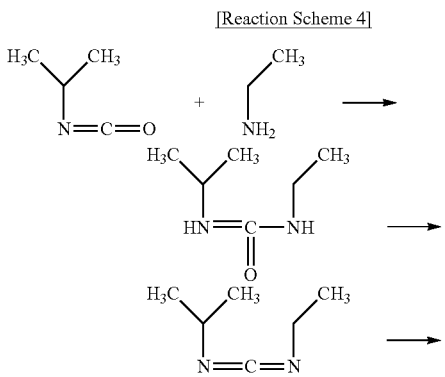

-continued

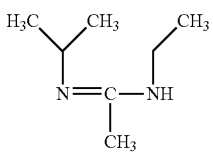

22 g of isopropylisocyanate and 180 g of dehydrated tetrahydrofuran were placed in a reaction flask and cooled under an argon (Ar) atmosphere. Next, 130 g (1 molar equivalent) of ethylamine-tetrahydrofuran solution was slowly dropped into the reaction flask, and the mixture was kept for 4 hours at room temperature to cause a reaction. Then, a solvent was removed, 500 g of dehydrated dichloromethane and 50 g of triethylamine were put into the reaction flask, and the resultant product was cooled. Then, 100 g of p-toluenesulfonyl chloride dissolved in 500 g dehydrated dichloromethane was slowly dropped into the reaction flask and stirred for 10 hours at room temperature. The obtained solution was neutralized with a potassium carbonate aqueous solution. Then, a divided oil layer was removed and dried with a dehydrating agent. Next, after removing a solvent, a liquid phase was extracted with diethylene ether, and N'-ethyl-N-isopropyl carbodiimide was distilled and separated by removing the solvent again. After adding 20 g of diethylene ether to the resultant and cooling the resultant product, 60 g of a methyllithium diethyl ether solution corresponding to 1 molar equivalent of carbodiimide included in the resultant product was slowly dropped to the resultant product and kept for 5 hours at room temperature to cause a reaction. 50 g of deionized water was slowly dropped to the resultant product and an oil layer was separated. The oil layer was dried with a dehydrating agent and desolventized. Then, 3.4 g of a target material was obtained by distilling and purifying the desolventized product under a reduced pressure of about 40 Pa at a temperature of about 30° C. to about 50° C.

[Analysis]
$^1$H-NMR (solvent: hexadeuterobenzene) (Chemical shift: multiplicity: number of hydrogens)
(1.138:s:6H), (1.150:s:3H), (1.325:s:3H), (2.735:s:1H), (3.249:m:2H), (3.856:s:1H)

Synthesis Example 2

Synthesis of the Lanthanum Compound of Chemical Formula 1

20 g of lanthanum tris(bis-trimethylsilylamide) complex and 60 g of dehydrated toluene were placed in a reaction flask under an Ar atmosphere, and 6.1 g (2 molar equivalents) of ethylcyclopentadiene was slowly dropped at room temperature into the reaction flask. Thereafter, the mixture was heated at a temperature of about 40° C. for about 5 hours and then heated at a temperature of about 60° C. for about 3 hours to cause a reaction. After desolventizing the resultant product, the desolventized resultant product was distilled and purified by heating the desolventized resultant product to a temperature of about 140° C. under a reduced pressure of about 40 Pa. 10 g of dehydrated toluene was added to the reaction flask, and 4.7 g of N-(tert-butyl)-N'-ethyl acetimidamide was slowly dropped into the reaction flask at room temperature. The resultant product was heated at a temperature of about 50° C. for about 3 hours and desolventized. Then, 6.8 g of a target material was obtained by distilling and purifying the desolventized resultant product under a reduced pressure of about 40 Pa and by separating a fraction at a temperature of about 135° C. to about 175° C.

[Analysis]
(1) Element analysis (analysis of metals: inductively coupled plasma-atomic emission spectroscopy (ICP-AES))
La: 30.1% (theoretical value: 29.78%), C: 56.5% (theoretical value: 56.65%), H: 7.7% (theoretical value: 7.56%), N: 5.7% (theoretical value: 6.01%)
(2) $^1$H-NMR (solvent: hexadeuterobenzene) (Chemical shift: multiplicity: number of hydrogens)
(1.052:t:3H), (1.089:s:9H), (1.232:t:6H), (1.578:s:3H), (2.576:m:4H), (2.895:m:2H), (6.099:d:8H)
(3) TG-DTA (thermogravimetric differential thermal analysis)
TGA (Ar 100 ml/min, heating rate of about 10° C./min, sample amount of about 9.718 mg)
50 mass % reduced temperature of about 266.8° C.

Synthesis Example 3

Synthesis of the Lanthanum Compound of Chemical Formula 2

20 g of lanthanum tris(bis-trimethylsilylamide) complex and 60 g of dehydrated toluene were placed in a reaction flask under an Ar atmosphere, and 6.1 g (2 molar equivalents) of ethyl cyclopentadiene was slowly dropped at room temperature into the reaction flask. Thereafter, the mixture was heated at a temperature of about 40° C. for about 5 hours and then heated at a temperature of about 60° C. for about 3 hours to cause a reaction. After desolventizing the resultant product, the desolventized resultant product was distilled and purified by heating to a temperature of about 140° C. under a reduced pressure of about 40 Pa. 20 g of dehydrated toluene was added to the reaction flask, and 4.2 g of N'-ethyl-N-isopropyl acetimidamide was slowly dropped into the reaction flask at room temperature. The resultant product was heated at a temperature of about 50° C. for about 3 hours and desolventized. Then, 7.1 g of a target material was obtained by distilling and purifying the desolventized product under a reduced pressure of about 40 Pa and by separating a fraction at a temperature of about 120° C. to about 170° C.

[Analysis]
(1) Element analysis (ICP-AES)
La: 30.9% (theoretical value: 30.70%), C: 55.4% (theoretical value: 55.75%), H: 7.7% (theoretical value: 7.35%), N: 6.0% (theoretical value: 6.19%)
(2) $^1$H-NMR (solvent: hexadeuterobenzene) (Chemical shift: multiplicity: number of hydrogens)
(0.965:d:6H), (1.039:t:3H), (1.220:t:6H), (1.478:s:3H), (2.561:m:4H), (2.936:m:2H), (3.279:t:1H). (6.099:d:8H)
(3) TG-DTA
TGA (Ar 100 ml/min. heating rate of about 10° C./min, sample amount of about 9.002 mg)
50 mass % reduced temperature of about 257.9° C.

Synthesis Example 4

Synthesis of the Lanthanum Compound of Chemical Formula 3

20 g of lanthanum tris(bis-trimethylsilylamide) complex and 60 g of dehydrated toluene were placed in a reaction flask under an Ar atmosphere, and 7.0 g (2 molar equivalents) of normal propyl cyclopentadiene was slowly dropped at room temperature into the reaction flask. Then, the mixture was heated at a temperature of about 40° C. for about 5 hours and then heated at a temperature of about 60° C. for about 5 hours to cause a reaction. After desolventizing the resultant product, the desolventized resultant product was distilled and purified by heating to a temperature of about 145° C. under a reduced pressure of about 40 Pa. 20 g of dehydrated toluene was added to the reaction flask, and 4.2 g of N'-ethyl-N-isopropyl acetimidamide was slowly dropped into the reaction flask at room temperature. The resultant product was heated at a temperature of about 50° C. for about 3 hours and desolventized. Then, 7.5 g of a target material was obtained by distilling and purifying the desolventized product under a reduced pressure of about 40 Pa and by separating a fraction at a temperature of about 130° C. to about 180° C.

[Analysis]

(1) Analysis of elements (analysis of metals: ICP-AES)

La: 29.1% (theoretical value: 28.91%), C: 57.3% (theoretical value: 57.5%), H: 7.8% (theoretical value: 7.76%), N: 5.8% (theoretical value: 5.83%)

(2) $^1$H-NMR (solvent: hexadeuterobenzene) (Chemical shift: multiplicity: number of hydrogens)

(0.941:d:6H), (0.966:t:6H), (1.053:t:3H), (1.494:s:3H), (1.622:m:4H), (2.522:t:4H). (2.946:m:2H), (3.299:t:1H), (6.097:t:4H), (6.183:s:4H)

(3) TG-DTA

TG-DTA (Ar 100 ml/min, heating rate of about 10° C./min, sample amount of about 9.745 mg)

50 mass % reduced temperature of about 267.3° C.

Figure 7:
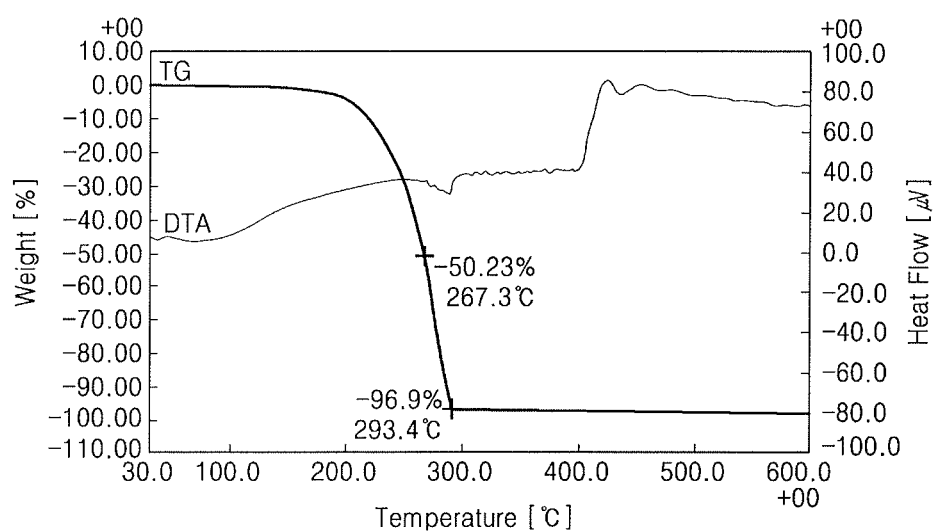
FIG. 7 illustrates a graph of a TG-DTA analysis result of a lanthanum compound according to an embodiment.

FIG. 7 illustrates a graph of a TG-DTA analysis result of a lanthanum compound of Chemical Formula 3 obtained in Synthesis Example 4.

Figure 8:
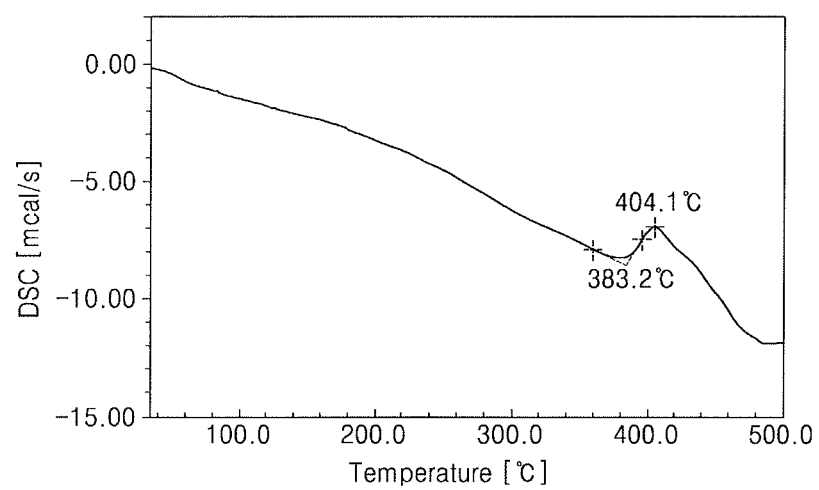
FIG. 8 illustrates a graph of a differential scanning calorimetry (DSC) analysis result of a lanthanum compound according to an embodiment.

FIG. 8 illustrates a graph of a differential scanning calorimetry (DSC) analysis result of the lanthanum compound of Chemical Formula 3 obtained in Synthesis Example 4.

Synthesis Example 5

Synthesis of the Lanthanum Compound of Chemical Formula 4

20 g of lanthanum tris(bis-trimethylsilylamide) complex and 60 g of dehydrated toluene were placed in a reaction flask under an Ar atmosphere, and 7.0 g (2 molar equivalents) of isopropyl cyclopentadiene was slowly dropped at room temperature into the reaction flask. Then, the mixture was heated at a temperature of about 40° C. for about 5 hours and then heated at a temperature of about 60° C. for about 5 hours to cause a reaction. The resultant product was desolventized, and the desolventized resultant product was then distilled and purified by heating the desolventized resultant product to a temperature of about 145° C. under a reduced pressure of about 40 Pa. 20 g of dehydrated toluene was added in the reaction flask, and 4.2 g of N'-ethyl-N-isopropyl acetimidamide was slowly dropped into the reaction flask at room temperature. The resultant product was heated at a temperature of about 50° C. for about 3 hours and desolventized. Then, 7.9 g of a target material was obtained by distilling and purifying the desolventized product under a reduced pressure of about 40 Pa and by separating a fraction at a temperature of about 130° C. to about 180° C.

[Analysis]

(1) Analysis of elements (analysis of metals: ICP-AES)

La: 28.5% (theoretical value: 28.91%), C: 56.3% (theoretical value: 57.5%), H: 8.2% (theoretical value: 7.76%), N: 7.0% (theoretical value: 5.83%)

(2) $^1$H-NMR (solvent: hexadeuterobenzene) (Chemical shift: multiplicity: number of hydrogens)

(0.989:d:6H), (1.054:t:3H), (1.238:d:12H), (1.490:s:3H), (2.876:m:2H), (2.952:m:2H), (3.297:t:1H), (6.174:d:8H)

(3) TG-DTA

TG-DTA (Ar 100 ml/min, heating rate of about 10° C./min, sample amount of about 9.522 mg)

50 mass % reduced temperature of about 270.4° C.

Figure 9:
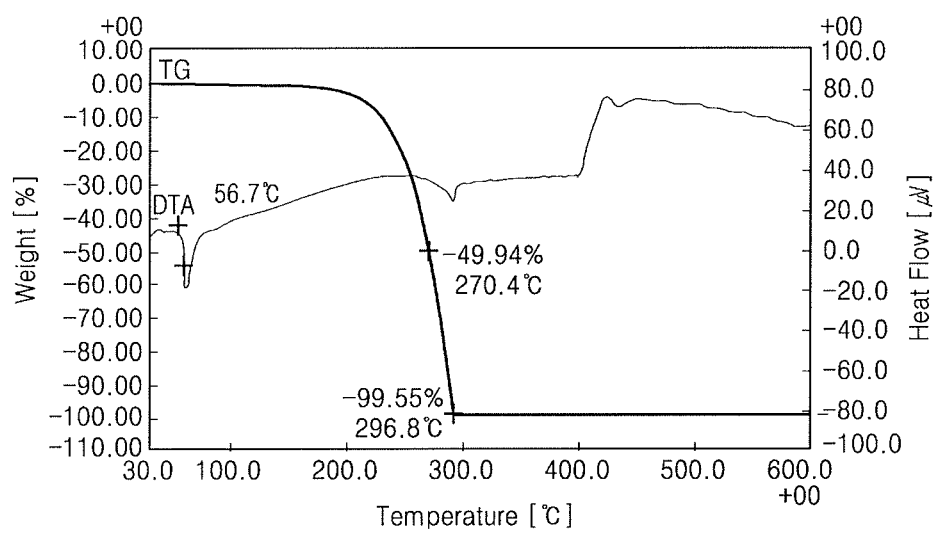
FIG. 9 illustrates a graph of a TG-DTA analysis result of a lanthanum compound according to another embodiment.

FIG. 9 illustrates a graph of a TG-DTA analysis result of a lanthanum compound of Chemical Formula 4 obtained in Synthesis Example 5.

Figure 10:
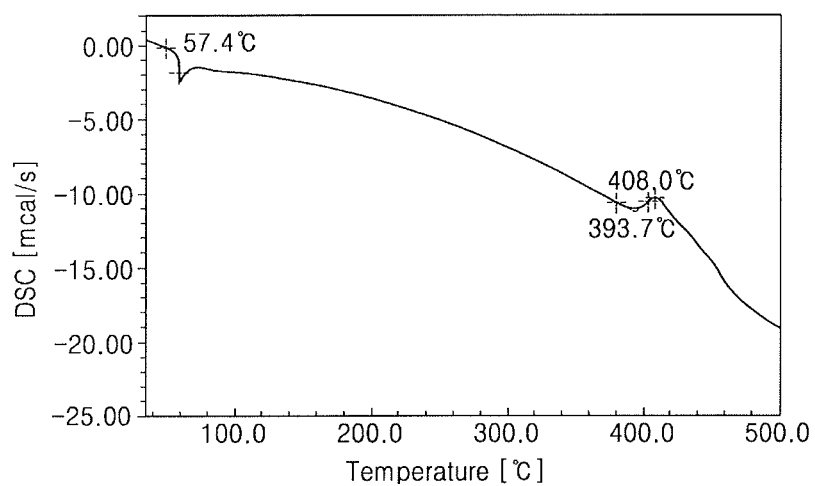
FIG. 10 illustrates a graph of a DSC analysis result of a lanthanum compound according to another embodiment.

FIG. 10 illustrates a graph of a DSC analysis result of the lanthanum compound of Chemical Formula 4 obtained in Synthesis example 5.

Synthesis Example 6

Synthesis of the Lanthanum Compound of Chemical Formula 8

40 g of lanthanum tris(bis-trimethylsilylamide) complex and 120 g of dehydrated toluene were placed in a reaction flask under an Ar atmosphere, and 12.1 g (2 molar equivalents) of ethyl cyclopentadiene was slowly dropped into the reaction flask at room temperature. Then, the mixture was heated at a temperature of about 40° C. for about 5 hours and then heated at a temperature of about 60° C. for about 3 hours to cause a reaction. The resultant product was desolventized, and the desolventized resultant product was then distilled and purified by heating the desolventized resultant product to a temperature of about 140° C. under a reduced pressure of about 40 Pa. 20 g of dehydrated toluene was added to the reaction flask, and 10.1 g of diisopropyl propionimidamide was slowly dropped into the reaction flask at room temperature. The resultant product was heated at a temperature of about 50° C. for about 3 hours and desolventized. Then, 13.0 g of a target material was obtained by distilling and purifying the desolventized product under a reduced pressure of about 40 Pa and by separating a fraction at a temperature of about 135° C. to about 170° C.

[Analysis]

(1) Analysis of elements (analysis of metals: ICP-AES)

La: 29.1% (theoretical value: 28.91%), C: 58.0% (theoretical value: 57.50%), H: 7.2% (theoretical value: 7.76%), N: 5.7% (theoretical value: 5.83%)

(2) $^1$H-NMR (solvent: hexadeuterobenzene) (Chemical shift: multiplicity: number of hydrogens)

(0.909:t:3H), (0.987:d:12H), (1.240:t:6H), (1.951:m:2H), (2.588:m:4H), (3.335:m:2H), (6.117:d:8H)

(3) TG-DTA

TG-DTA (Ar 100 ml/min, heating rate of about 10° C./min, sample amount of about 10.754 mg)

50 mass % reduced temperature of about 268.5° C.

Figure 11:
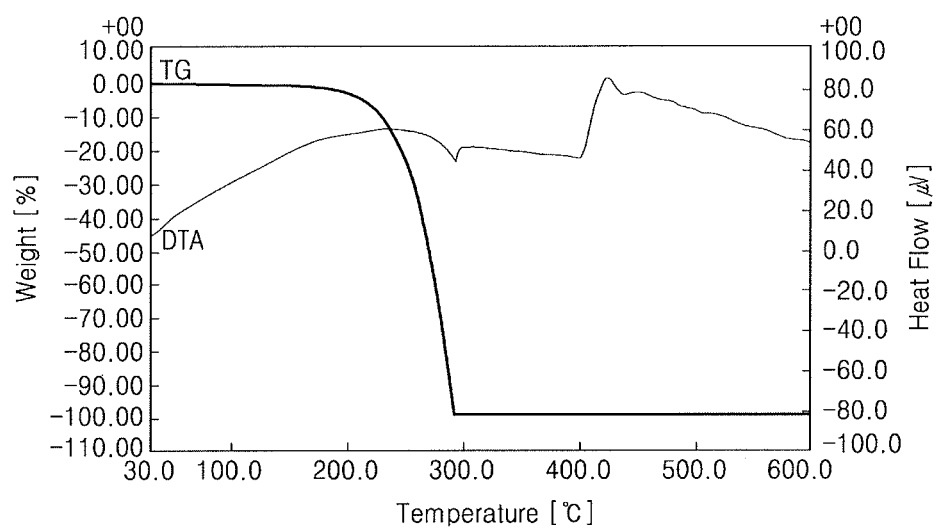
FIG. 11 illustrates a graph of a TG-DTA analysis result of a lanthanum compound according to another embodiment.

FIG. 11 illustrates a graph of a TG-DTA analysis result of the lanthanum compound of Chemical Formula 8 obtained in Synthesis Example 6.

Figure 12:
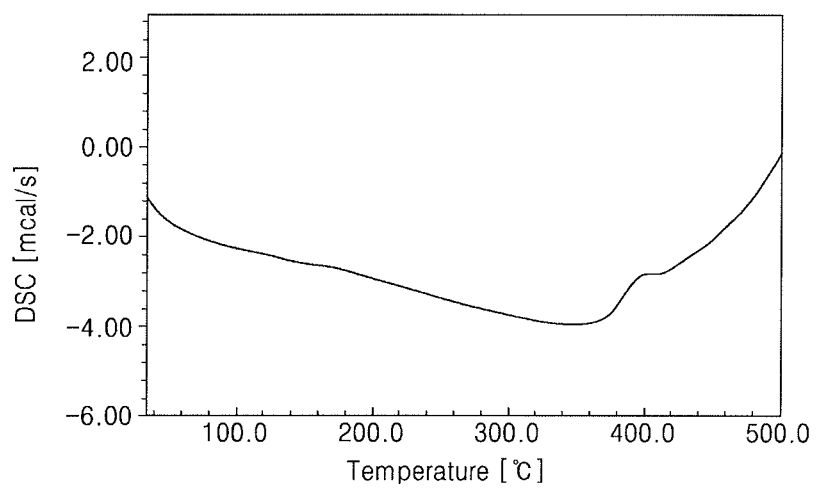
FIG. 12 illustrates a graph of a DSC analysis result of a lanthanum compound according to another embodiment.

FIG. 12 illustrates a graph of a DSC analysis result of the lanthanum compound of Chemical Formula 8 obtained in Synthesis Example 6.

Estimation Example 1

Formation Example 1 of a Lanthanum Oxide Film

A lanthanum oxide film was formed on a silicon substrate via an ALD process using the lanthanum compound of Chemical Formula 8 obtained in Synthesis Example 6 as a material using the deposition device 200A shown in FIG. 3.

In the present Estimation Example 1, the ALD process was performed at a reaction temperature (substrate temperature) of about 150° C. to about 350° C. by using a gas mixture, in which $O_3$ and $O_2$ are mixed in a mass ratio of 20 wt %:80 wt %, as a reactive gas.

For the present estimation, a single cycle including a series of processes (1) to (4) described below was repeated 100 times.

(1) a process of introducing the vaporized lanthanum compound of Chemical Formula 8 into a reaction chamber and adsorbing the vaporized lanthanum compound of Chemical Formula 8 onto a substrate for about 10 seconds under a pressure of about 93 Pa (2) a process of performing a purge process using argon for about 10 seconds and removing unreacted sources from the reaction chamber (3) a process of introducing a reactive gas into the reaction chamber and causing a reaction for about 10 seconds under a pressure of about 93 Pa (4) a process of performing a purge process using argon for about 10 seconds and removing unreacted sources from the reaction chamber From a thickness measuring result of thin films by X-ray reflectometry (XRR) and confirmation results of structure and composition of the thin films by X-ray photoelectron spectroscopy (XPS), all part of the thin film obtained in Estimation Example 1 was lanthanum oxide film, and a thickness in a range from about 1.0 Å to about 1.5 Å was obtained in each cycle of the ALD process.

Figure 13:
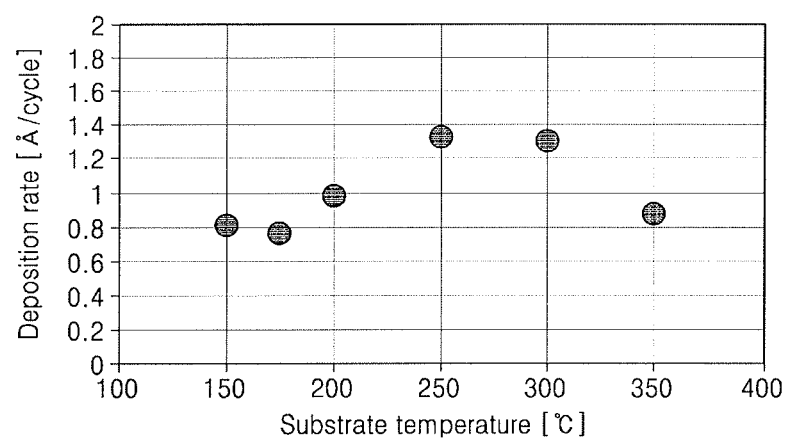
FIG. 13 illustrates a graph of a deposition rate relative to a deposition temperature in a process of forming a lanthanum oxide film by using a method of forming a thin film according to an embodiment.

FIG. 13 illustrates a graph of a deposition rate relative to a deposition temperature in a process of forming a lanthanum oxide film in the Estimation Example 1 described above.

From the Estimation result of FIG. 13, it may be seen that a temperature section in which the deposition speed is constant even though the deposition temperature is increased, that is, the ALD behavior section, is in a range of about 250° C. to about 300° C.

Figure 14:
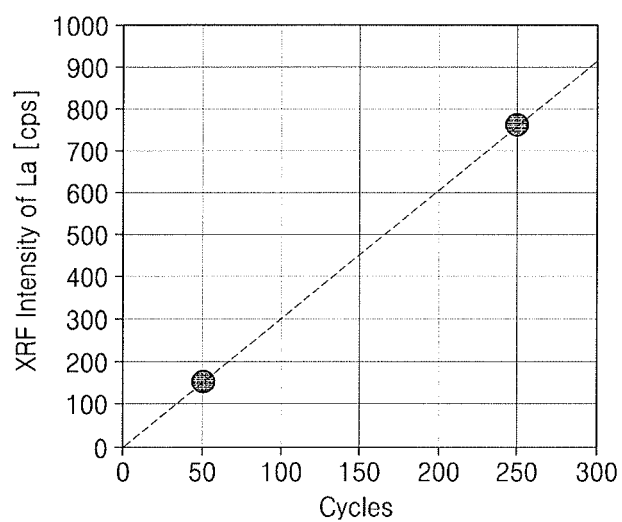
FIG. 14 illustrates a graph of a result of an X-ray fluorescence (XRF) relative to a deposition cycle in a process of forming a lanthanum oxide film by using the method of forming a thin film according to an embodiment.

FIG. 14 illustrates a graph showing an Estimation result by an X-ray fluorescence (XRF) to confirm a thickness variation relative to a deposition cycle at a relatively low temperature condition in which the temperature inside the reaction chamber is 175° C.

From the Estimation result of FIG. 14, it is confirmed that there was no incubation time at the initial stage of the deposition under a relatively low temperature condition in which the temperature inside the reaction chamber was 175° C.

Estimation Example 2

Formation Example 2 of a Lanthanum Oxide Film

A lanthanum oxide film was formed on a silicon substrate by using the same method used in Estimation Example 1 except that the lanthanum compound of Chemical Formula 10 was used as a material instead of the lanthanum compound of Chemical Formula 8.

From a thickness measuring result of thin films by XRR and confirmation results of structure and composition of the thin films by XPS, all part of the thin film obtained in Estimation Example 2 was lanthanum oxide film, and a thickness in a range from about 0.5 Å to about 0.6 Å was obtained in each cycle of the ALD process.

As it is seen from the Estimation Examples 1 and 2, in the lanthanum compound of Formula 1 according to the embodiment, the thickness of the lanthanum oxide film obtained in each cycle of the ALD process is greater when the $R^4$ is an ethyl group than a methyl group, and accordingly, the productivity of the process of forming the lanthanum oxide film is increased.

Figure 15:
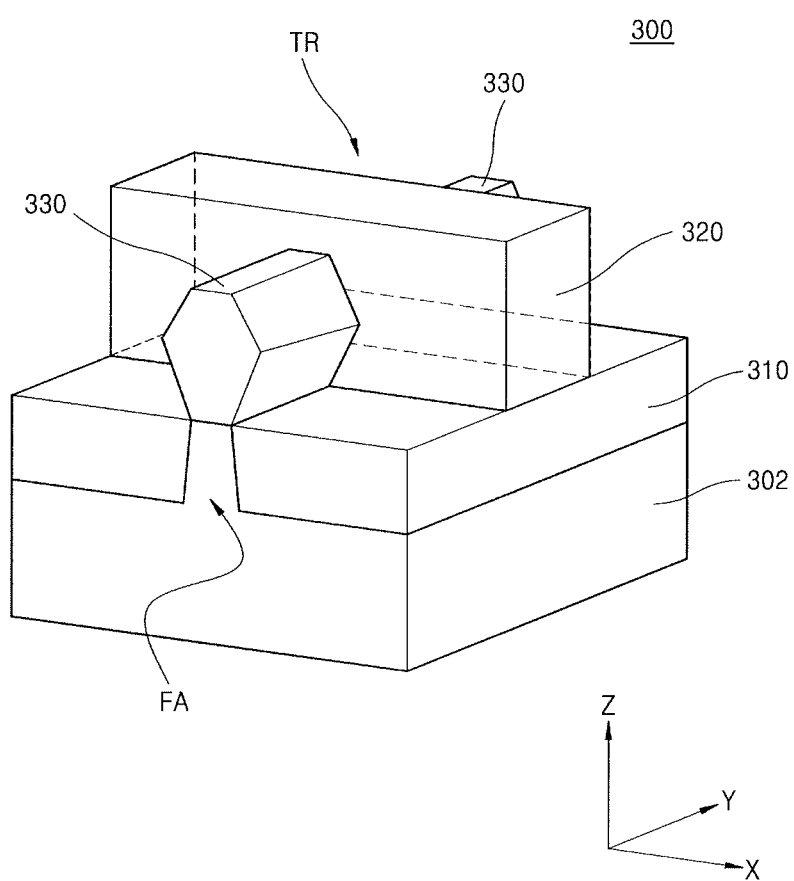
FIG. 15 illustrates a perspective view of an integrated circuit device according to an embodiment.

FIG. 15 illustrates a perspective view of an integrated circuit device 300 according to an embodiment.

Referring to FIG. 15, the integrated circuit device 300 may include a fin-type active region FA protruding from a substrate 302. The fin-type active region FA may extend in a direction (in a Y direction in FIG. 15).

The substrate 302 may include a semiconductor, such as Si or Ge, or a compound semiconductor, such as SiGe, SiC, GaAs, InAs, or InP.

A device isolation film 310 covering a lower sidewall of the fin-type active region FA may be formed on the substrate 302. The fin-type active region FA may protrude in a fin shape on the device isolation film 310. In some embodiments, the device isolation film 310 may include a silicon oxide film, a silicon nitride film, a silicon oxynitride film, or a combination thereof.

A gate structure 320 may be formed on the fin-type active region FA formed on the substrate 302. The gate structure 320 may extend in a direction (an X direction) crossing an extending direction of the fin-type active region FA. A pair of source and drain regions 330 may be formed on both sides of the gate structure 320 on the fin-type active region FA. The pair of source and drain regions 330 may include a semiconductor layer epitaxially grown from the fin-type active region FA. Each of the pair of source and drain regions 330 may include a plurality of epitaxially grown SiGe layers, an epitaxially grown silicon layer, or an epitaxially grown SiC layer.

A transistor TR may be formed on an intersection between the fin-type active region FA and gate structure 320. The transistor TR may have a three-dimensional structure in which channels are formed on an upper surface and both side surfaces of the fin-type active region FA. The transistor TR may constitute an NMOS transistor or a PMOS transistor.

FIGS. 16A through 16G illustrate cross-sectional views of stages in a method of manufacturing the integrated circuit device 300 of FIG. 15. In FIGS. 16A through 16G, (A) is a cross-sectional view of a portion corresponding to a cross-section in the X direction of FIG. 15, and (B) is a cross-sectional view of a portion corresponding to a cross-section in the Y direction of FIG. 15. In FIGS. 16A through 16G, like reference numerals are used to indicate elements that are substantially identical to the elements of FIG. 15, and thus the detailed description thereof may not be repeated.

Figure 16A:
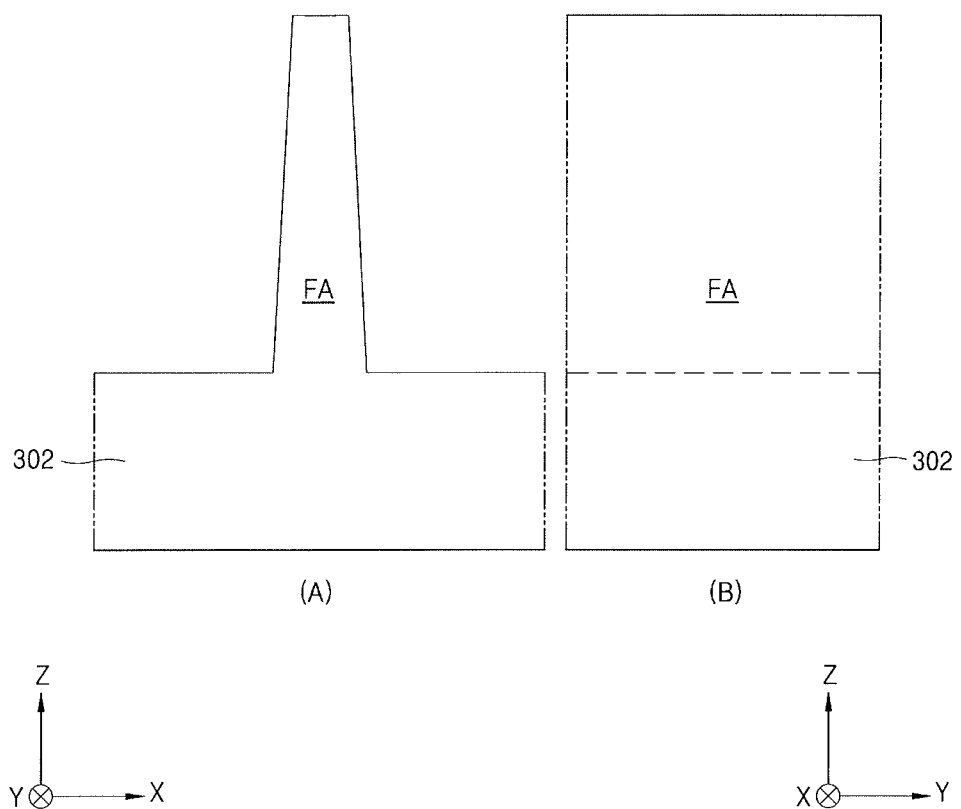
FIGS. 16A through 16G illustrate cross-sectional views of stages in a method of manufacturing an integrated circuit device according to an embodiment.

Referring to FIG. 16A, the fin-type active region FA may be formed by partially etching the substrate 302. The fin-type active region FA may have a structure extending in the Y direction on the substrate 302.

Figure 16B:
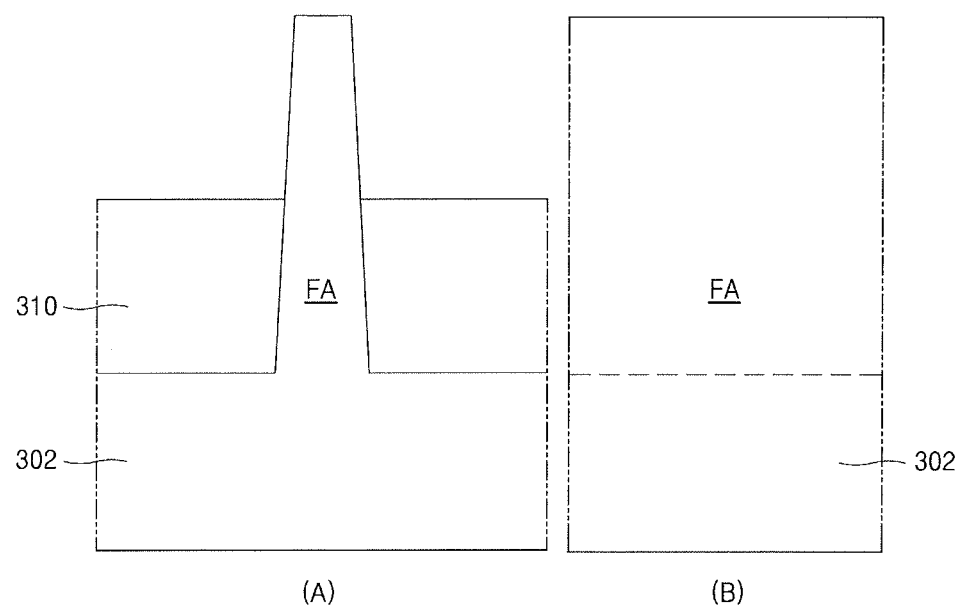

Referring to FIG. 16B, the device isolation film 310 covering both lower sidewalls of the fin-type active region FA may be formed. After forming the device isolation film 310, an upper part of the fin-type active region FA may have a structure protruding above the device isolation film 310.

Figure 16C:
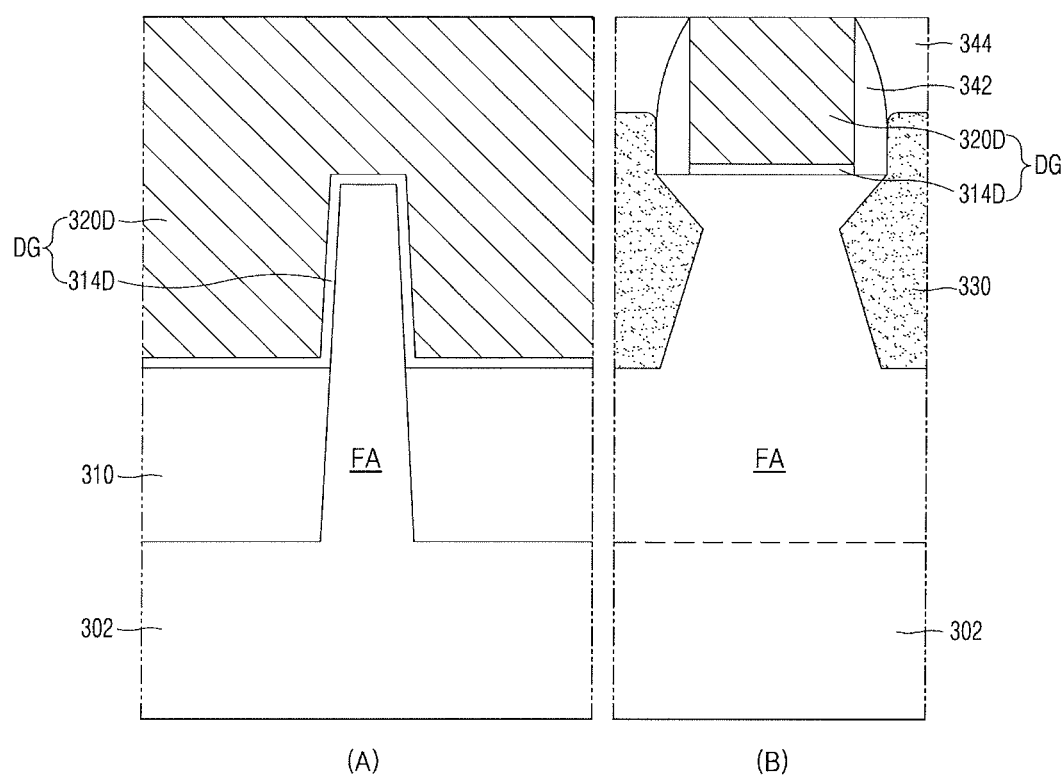

Referring to FIG. 16C, a dummy gate structure DG including a dummy gate insulating film 314D and a dummy gate electrode 320D may be formed. The dummy gate structure DG may cover an upper portion of the fin-type active region FA. Insulating spacers 342 covering both sidewalls of the dummy gate structure DG may be formed. Afterwards, source and drain regions 330 may be formed in the fin-type active region FA on both sides of the dummy gate structure DG. An interlayer insulating film 344 covering the source and drain regions 330 may be formed on both sides of the dummy gate structure DG.

The dummy gate structure DG may extend in a direction (an X direction) crossing an extending direction of the fin-type active region FA. In some embodiments, the dummy gate insulating film 314D may include a silicon oxide film, the dummy gate electrode 320D may include polysilicon, and the insulating spacers 342 may include a silicon nitride film. The interlayer insulating film 344 may include a silicon oxide film, a silicon nitride film, or a combination of these materials.

Figure 16D:
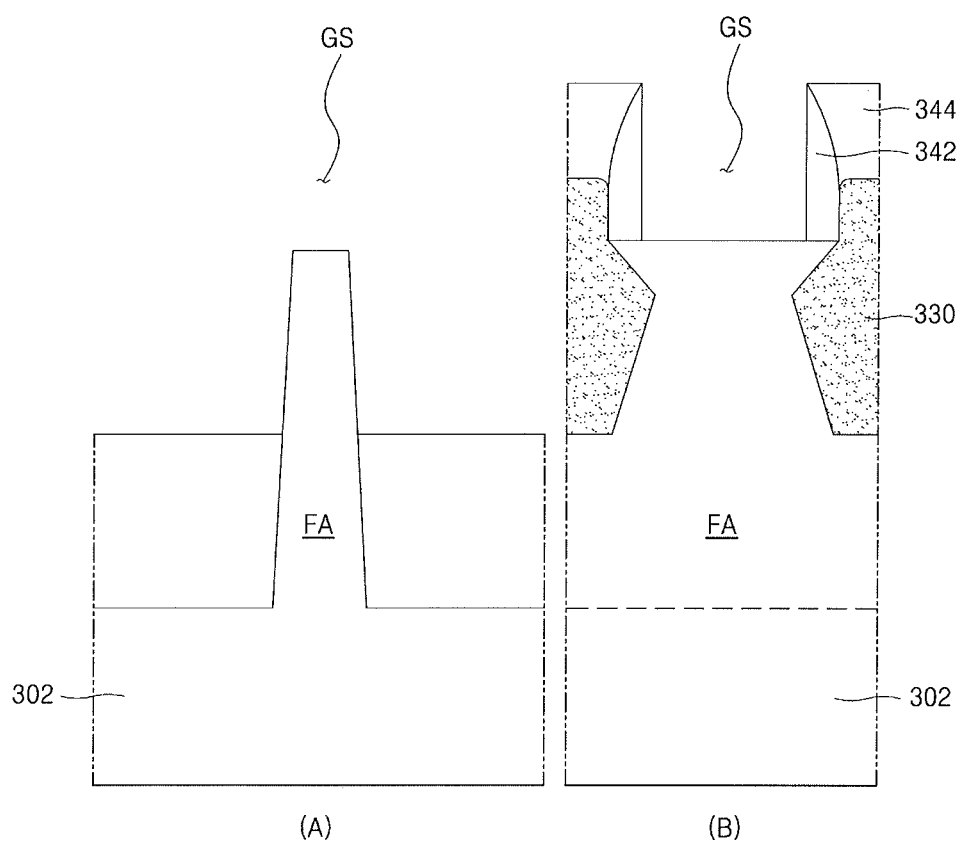

Referring to FIG. 16D, the dummy gate structure DG exposed through the interlayer insulating film 344 may be removed, and thus, the fin-type active region FA is through a gate space GS between a pair of insulating spacers 342.

Figure 16E:
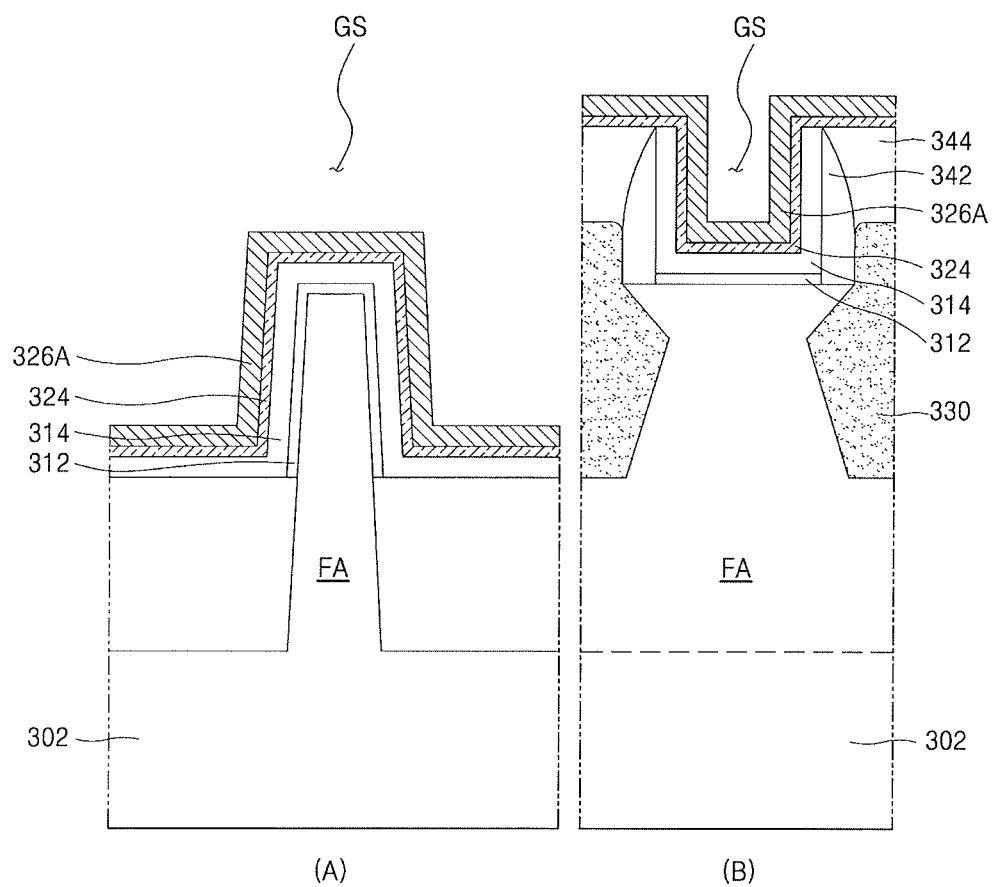

Referring to FIG. 16E, an interface layer 312 and a high-k dielectric film 314 may be sequentially formed on the surface of the fin-type active region FA exposed through the gate space GS.

The interface layer 312 may constitute a gate insulating film together with the high-k dielectric film 314. The interface layer 312 may include an insulating material, such as an oxide film, a nitride film, or an oxynitride film. The high-k dielectric film 314 may include a metal oxide or a metal oxynitride having a dielectric constant in a range of about 10 to about 25. For example, the high-k dielectric film 314 may include hafnium oxide, hafnium oxynitride, hafnium silicon oxide, zirconium oxide, or zirconium silicon oxide. The high-k dielectric film 314 may be formed by an ALD process or a CVD process.

Afterwards, a lanthanum-containing film 324 is formed on the high-k dielectric film 314 by using the lanthanum compound of Formula 1 according to the embodiment. In an implementation, the lanthanum-containing film 324 may include a $La_2O_3$ thin film. In order to form the lanthanum-containing film 324, the method of forming a thin film described with reference to FIGS. 1 and 2 may be used.

Next, a first metal-containing layer 326A may be formed on the lanthanum-containing film 324. The first metal-containing layer 326A may include TiN, TaN, TiAlN, TaAlN, TiSiN, or a combination of these materials.

Figure 16F:
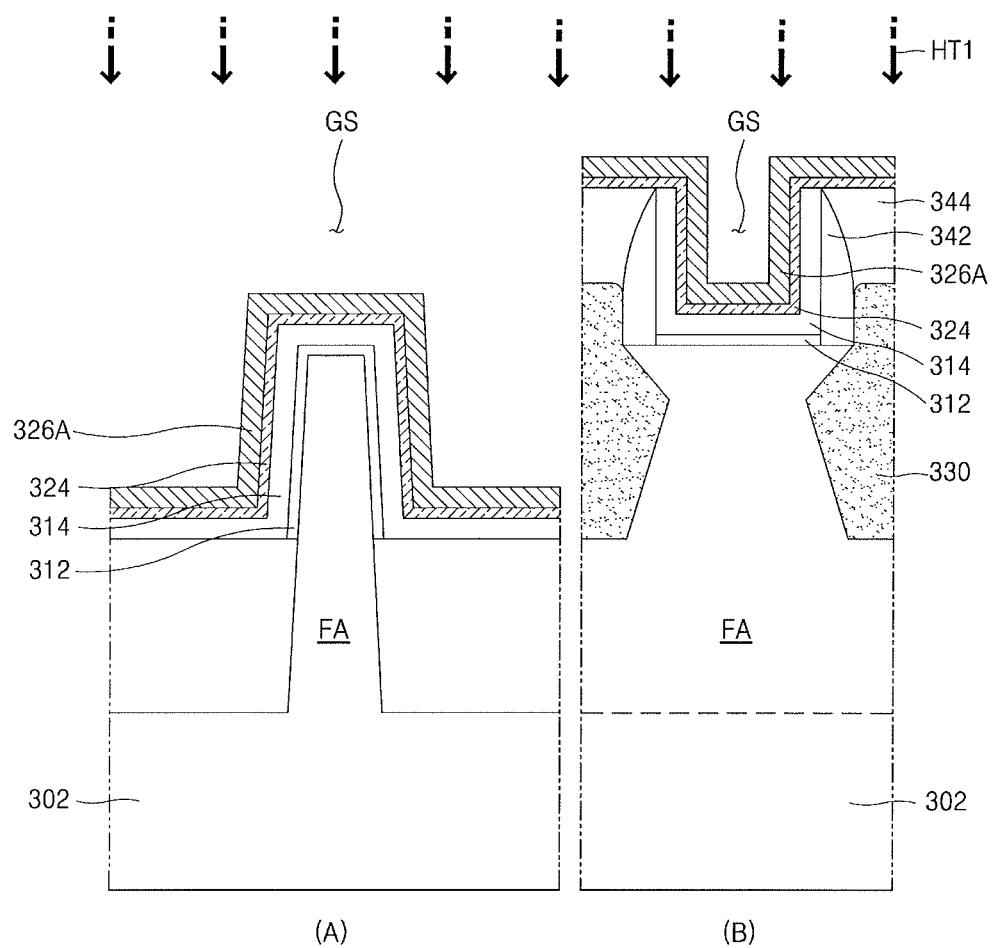

Referring to FIG. 16F, the resultant product in which the first metal-containing layer 326A is exposed may be heat-treated HT1 in the gate space GS. The heat-treatment HT1 may be performed, e.g., at a temperature in a range of about 400° C. to about 600° C. for about 5 minutes to about 1 hour. Due to the heat-treatment HT1, La atoms may be diffused to an interface between the interface layer 312 and the high-k dielectric film 314 from the lanthanum-containing film 324.

An amount of La atoms that diffuse into the interface between the interface layer 312 and the high-k dielectric film 314 may be controlled by using various methods based on the result of the heat treatment HT1. For example, the amount of La atoms present in the interface between the interface layer 312 and the high-k dielectric film 314 may be controlled by using film quality and a film thickness of the high-k dielectric film 314 and a temperature of the heat-treatment HT1. In an implementation, the process of heat-treatment HT1 described with reference to FIG. 16F may be omitted.

As a method of controlling a threshold voltage Vth of the transistor TR shown in FIG. 15, as described with reference to FIG. 16F, a method of injecting La atoms into the interface between the interface layer 312 and the high-k dielectric film 314 may be used. The lanthanum-containing film 324 may be used as a source of La atoms to be injected into the interface between the interface layer 312 and the high-k dielectric film 314. La atoms may be supplied to the interface between the interface layer 312 and the high-k dielectric film 314 from the lanthanum-containing film 324 through a diffusion process. La atoms present in the interface between the interface layer 312 and the high-k dielectric film 314 may form a dipole together with a constituent material, for example, $SiO_2$ or SiON of the interface layer 312, and thus, the threshold voltage Vth of the transistor TR may be changed.

Figure 16G:
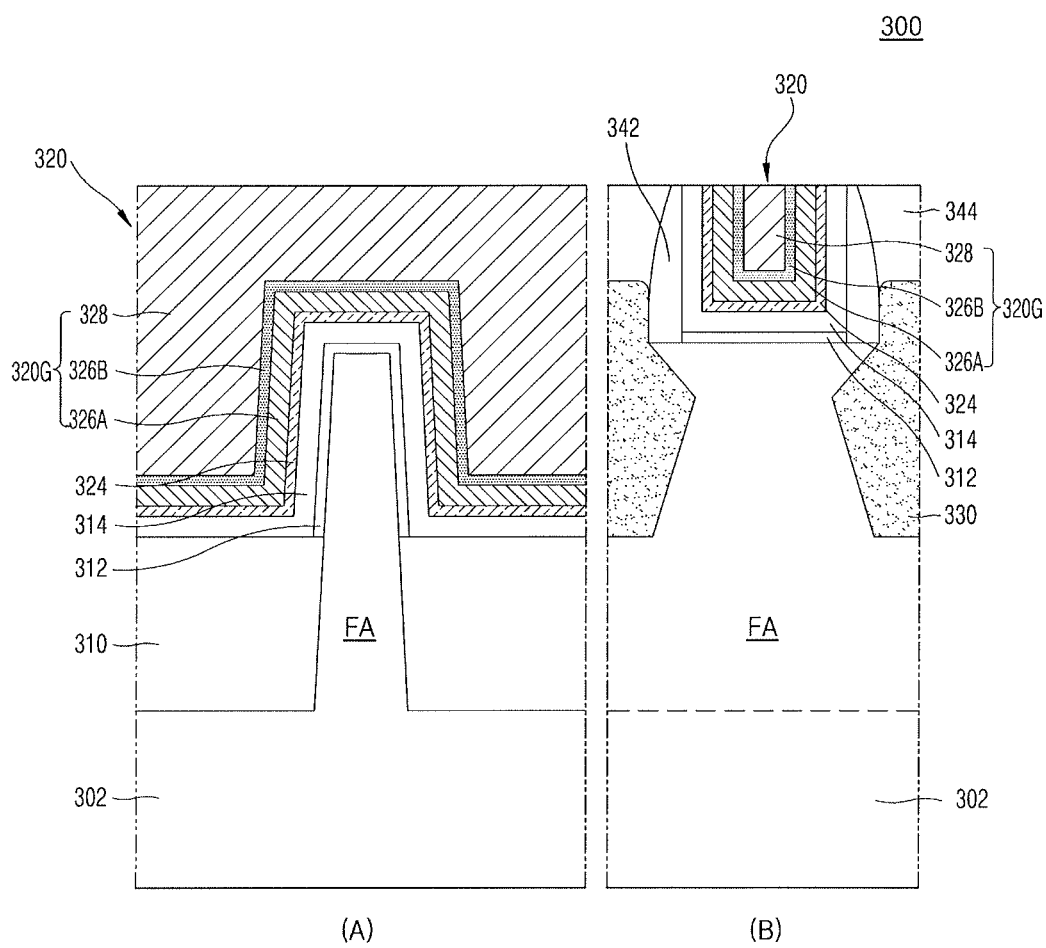

Referring to FIG. 16G, after sequentially forming a second metal-containing layer 326B and a gap-fill metal layer 328 on the first metal-containing layer 326A, a planarizing process, for example, a chemical mechanical polishing (CMP) process may be performed until an upper surface of the interlayer insulating film 344 is exposed, and thus, the integrated circuit device 300 may be formed.

The first metal-containing layer 326A, the second metal-containing layer 326B, and the gap-fill metal layer 328 may constitute a gate 320G. The interface layer 312, the high-k dielectric film 314, the lanthanum-containing film 324, and the gate 320G may constitute a gate structure 320.

The second metal-containing layer 326B may control a work function of the gate 320G together with the first metal-containing layer 326A. In an implementation, the second metal-containing layer 326B may include TiAlC, TiAlN, TiAlCN, TiAl, TaAlC, TaAlN, TaAlCN, TaAl, or a combination of these materials. In an implementation, the second metal-containing layer 326B may include at least one of Mo, Pd, Ru, Pt, TiN, WN, TaN, Ir, TaC, RuN, and MoN. The second metal-containing layer 326B may include a single layer or a multilayered structure.

The first metal-containing layer 326A may include La atoms diffused from the lanthanum-containing film 324. The La atoms injected to the first metal-containing layer 326A may affect charge density in the first metal-containing layer 326A, and accordingly, the threshold voltage Vth of the gate 320G may be changed.

The gap-fill metal layer 328 may be formed to fill the remaining gate space GS on the second metal-containing layer 326B. If there is no remaining gate space GS on the second metal-containing layer 326B, the gap-fill metal layer 328 on the second metal-containing layer 326B may not be formed. The gap-fill metal layer 328 may include tungsten (W), a metal nitride, such as TiN and TaN, aluminum (Al), a metal carbide, a metal silicide, a metal aluminum carbide, a metal aluminum nitride, a metal silicon nitride, or a combination of these materials.

The integrated circuit device 300 formed by the method described with reference to FIGS. 16A through 16G may include La atoms in an interface between the interface layer 312 and the high-k dielectric film 314. Also, the first metal-containing layer 326A above the interface may also include La atoms. Accordingly, a transistor TR having a precisely controlled threshold voltage Vth may be realized.

In an implementation, as described with reference to FIG. 16E, to form the lanthanum-containing film 324, an ALD process using the lanthanum compound of Formula 1 according to the embodiment may be used as a precursor. In the ALD process for forming the lanthanum-containing film 324, the lanthanum compound of Formula 1 may provide characteristics for a source compound of the ALD process, e.g., a relatively low melting point, a relatively high vapor pressure, transportability in a liquid state, ease of vaporization, and excellent thermal stability. Accordingly, a process of forming the lanthanum-containing film 324 may be easily performed by using the lanthanum compound of Formula 1.

Figure 17:
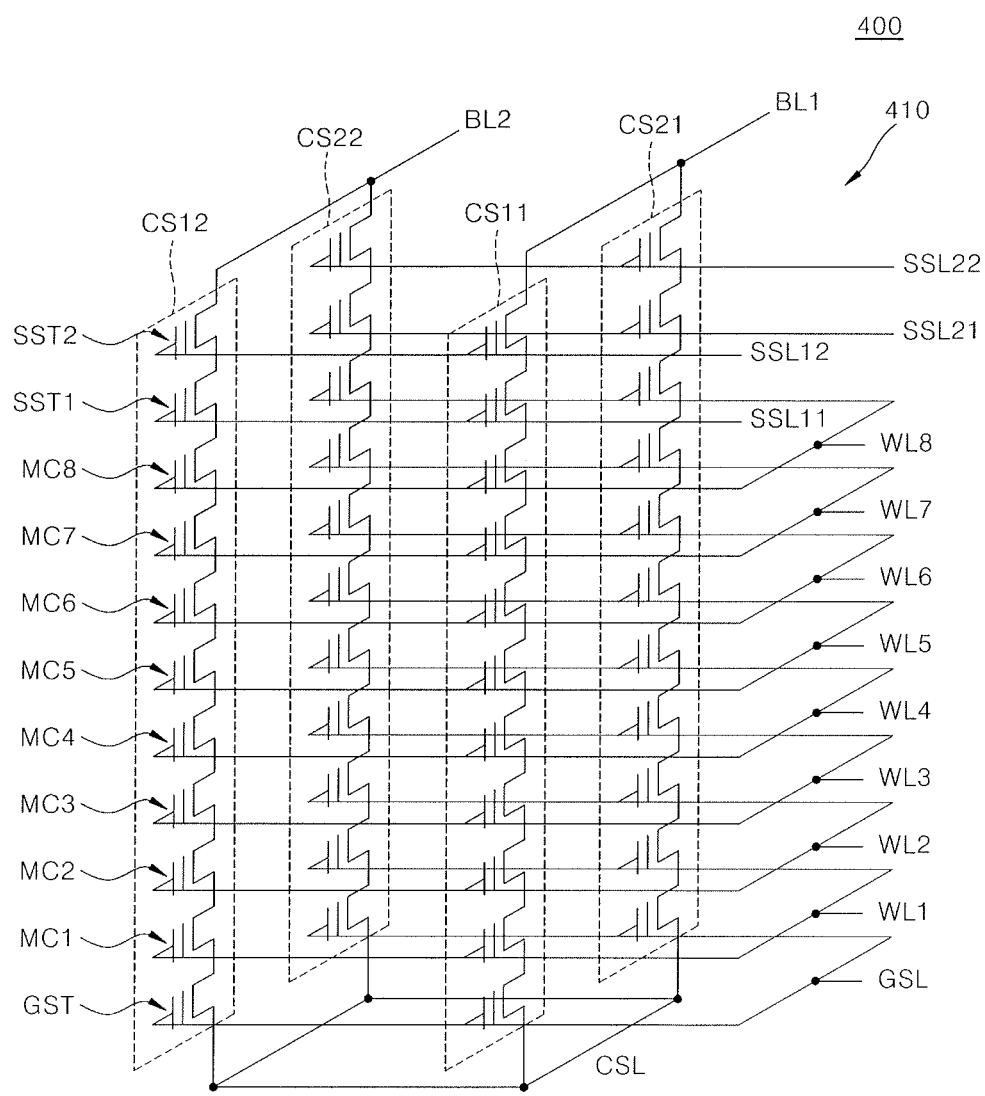
FIG. 17 illustrates an equivalent circuit diagram of an integrated circuit device according to another embodiment.

FIG. 17 illustrates an equivalent circuit diagram of an integrated circuit device 400 according to another embodiment. In FIG. 17, an equivalent circuit diagram of a vertical NAND (VNAND) flash memory device having a vertical channel structure is depicted.

A memory cell array 410 may have a 3D structure. The memory cell array 410 may include a plurality of cell strings CS11, CS12, CS21, and CS22 that extend in a vertical direction. Each of the cell strings CS11, CS12, CS21, and CS22 may include a ground selection transistor GST, a plurality of memory cell transistors MC1, MC2, . . . MCn−1, and MC8, and string selection transistors SST1 and SST2, which are connected in series. In FIG. 17, and it is depicted as an example that one ground selection transistor GST and two string selection transistors SST1 and SST2 are connected to the plurality of cell strings CS11, CS12, CS21, and CS22.

The string selection transistors SST1 and SST2 of each of the cell strings CS11, CS12, CS21, and CS22 may be connected to corresponding bit lines BL1 and BL2. Also, the string selection transistors SST1 and SST2 of each of the cell strings CS11, CS12, CS21, and CS22 may be connected to string selection lines SSL11, SSL12, SSL21, and SSL22. The ground selection transistors GST of the cell strings CS11, CS12, CS21, and CS22 may be connected by ground selection lines GSL. A common source line CSL may be connected to the ground selection transistor GST of each of the cell strings CS11, CS12, CS21, and CS22.

The plurality of memory cell transistors MC1, MC2, . . . MCn−1, and MC8 arranged at the same level may be connected to the same gate lines WL1, WL2, . . . WLn−1, and WL8. For example, a first memory cell transistor MC1 connected to the ground selection transistor GST may be connected to first memory cell transistors MC1 of adjacent columns through the gate line WL1.

The integrated circuit device 400 shown in FIG. 17 may include a lanthanum-containing film obtained by using the lanthanum compound of Formula 1 according to the embodiment.

Figure 18:
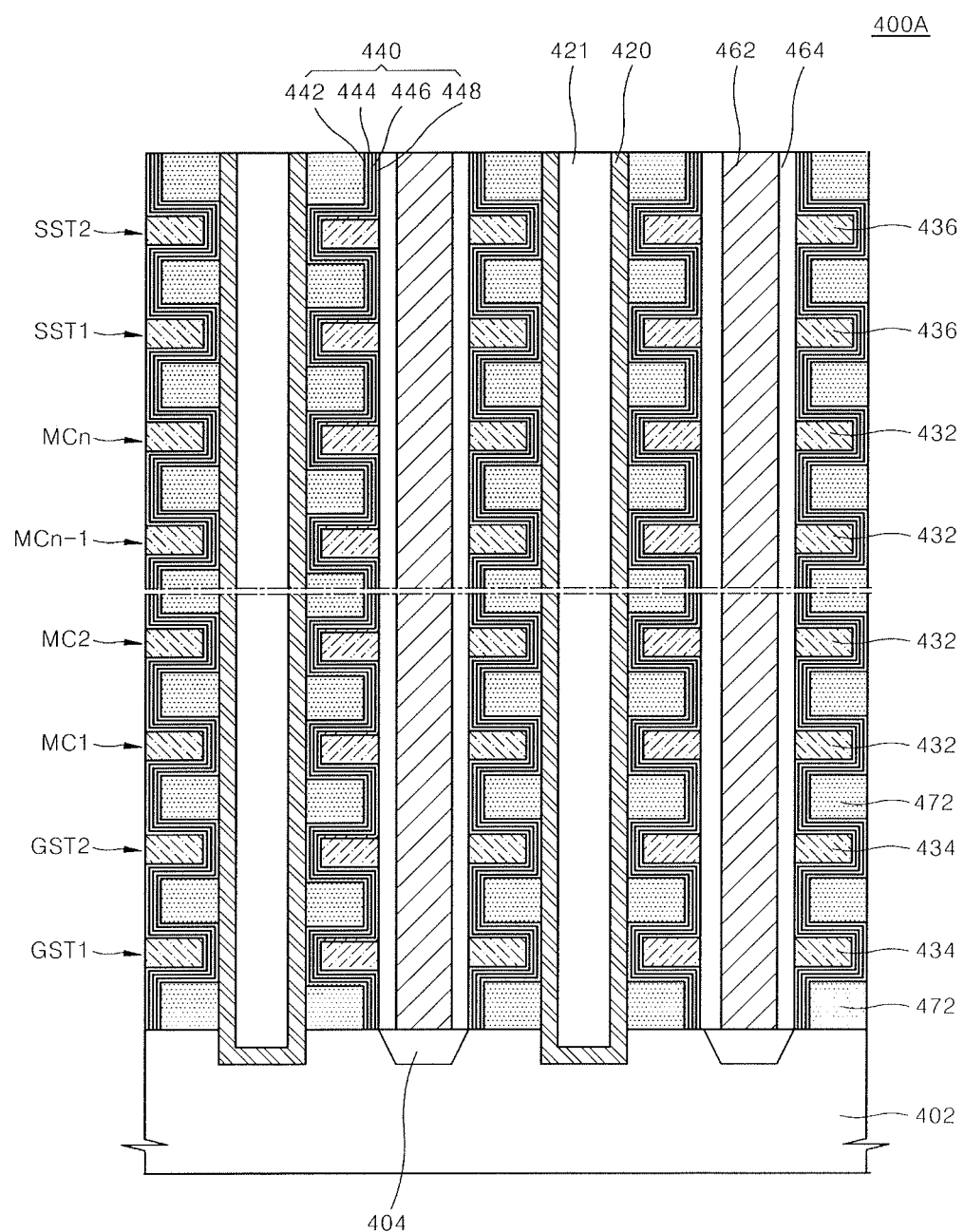
FIG. 18 illustrates a cross-sectional view of a partial configuration of an example non-volatile memory device that may configure a memory cell array of the example integrated circuit device of FIG. 17.

FIG. 18 illustrates a diagram of an example integrated circuit device including a lanthanum-containing film according to the embodiment. FIG. 18 illustrates a cross-sectional view of a partial configuration of an example non-volatile memory device 400A that may constitute a memory cell array 410 of the example integrated circuit device 400 of FIG. 17. In FIG. 18, the bit lines BL1 and BL2 shown in FIG. 17 are omitted.

Referring to FIG. 18, the non-volatile memory device 400A may include ground selection transistors GST1 and GST2, a plurality of memory cell transistors MC1, MC2, . . . MCn−1, and MCn, and string selection transistors SST1 and SST2, which are sequentially formed on a substrate 402. An insulating layer 472 may be arranged between each of the ground selection transistors GST1 and GST2, the plurality of memory cell transistors MC1, MC2, . . . MCn−1, and MCn, and the string selection transistors SST1 and SST2.

Detailed descriptions of the substrate 402 may be generally the same as the substrate 302 described with reference to FIG. 15. A channel layer 420 may vertically extend on a partial region of the substrate 402. A plurality of control gate electrodes 432, 434, and 436 that constitute the plurality of memory cell transistors MC1, MC2, . . . MCn−1, and MCn, the ground selection transistors GST1 and GST2, and the string selection transistors SST1 and SST2, may be arranged along sidewalls of the channel layer 420.

A storage structure 440 may be interposed between the control gate electrodes 432, 434, and 436 and the channel layer 420. The storage structure 440 may continuously extend along surfaces of the control gate electrode 432, 434, and 436. An inside of the channel layer 420 may be filled with a buried insulating film 421.

The storage structure 440 may include a lanthanum-containing film 448 that is obtained by using the lanthanum compound of Formula 1 according to the embodiment. In FIG. 18, a case that the storage structure 440 includes a tunneling insulating layer 442, a charge storage layer 444, a blocking insulating layer 446, and a lanthanum-containing film 448 that are sequentially stacked on a surface of the channel layer 420 is depicted. The storage structure 440 may function as a gate insulating film.

In an implementation, the tunneling insulating layer 442 may include silicon oxide, the charge storage layer 444 may include silicon nitride, the blocking insulating layer 446 may include aluminum oxide, and the lanthanum-containing film 448 may include $La_2O_3$.

Each of the plurality of memory cell transistors MC1, MC2, . . . MCn−1, and MCn may include the control gate electrode 432 that may be electrically connected to the storage structure 440. Each of the ground selection transistors GST1 and GST2 may include the control gate electrode 434 that may be electrically connected to the storage structure 440. Each of the string selection transistors SST1 and SST2 may include the control gate electrode 436 that may be electrically connected to the storage structure 440.

Each of the control gate electrodes 432, 434, and 436 may include a conductive barrier film that may be in contact with the lanthanum-containing film 448 of the storage structure 440 and a conductive film formed on the conductive barrier film. The conductive film may include conductive polysilicon, a metal, a metal silicide, or a combination of these materials. For example, the conductive film may include titanium silicide, tantalum silicide, tungsten silicide, cobalt silicide, or lanthanum silicide.

A common source line 462 may be arranged on a source region 404 formed in an upper region of the substrate 402. The ground selection transistors GST1 and GST2, the plurality of memory cell transistors MC1, MC2, . . . MCn−1, and MCn, and the string selection transistors SST1 and SST2 may be located between the channel layer 420 and the common source line 462. Sidewalls of the common source line 462 may be covered with insulating spacers 464.

In the non-volatile memory device 400A shown in FIG. 18, the storage structure 440 may include a lanthanum-containing film 448 that is interposed between the blocking insulating layer 446 and the control gate electrodes 432, 434, and 436. Thus, since the storage structure 440 includes the lanthanum-containing film 448 that includes a high-k dielectric film, the reliability of the non-volatile memory device 400A may be increased.

In the non-volatile memory device 400A shown in FIG. 18, the lanthanum-containing film 448 included in the storage structure 440 may be formed via an ALD process using the lanthanum compound of Formula 1 according to the embodiment.

In an implementation, the method described with reference to FIGS. 1 and 2 may be used to form the lanthanum-containing film 448.

In the ALD process for forming the lanthanum-containing film 448, the lanthanum compound of Formula 1 according to the embodiment may provide characteristics suitable for the source compound, e.g., a relatively low melting point, a relatively high vapor pressure, transportability in a liquid state, vaporization easiness, and excellent thermal stability. Accordingly, a process of forming the lanthanum-containing film 448 by using the lanthanum compound of Formula 1 may be readily performed. Also, when the lanthanum compound of Formula 1 according to the embodiment is supplied into a hole having a relatively high aspect ratio to form the storage structure 440 of the non-volatile memory device 400A, a uniform step-coverage characteristic can be obtained along a depth direction of the hole.

Figure 19:
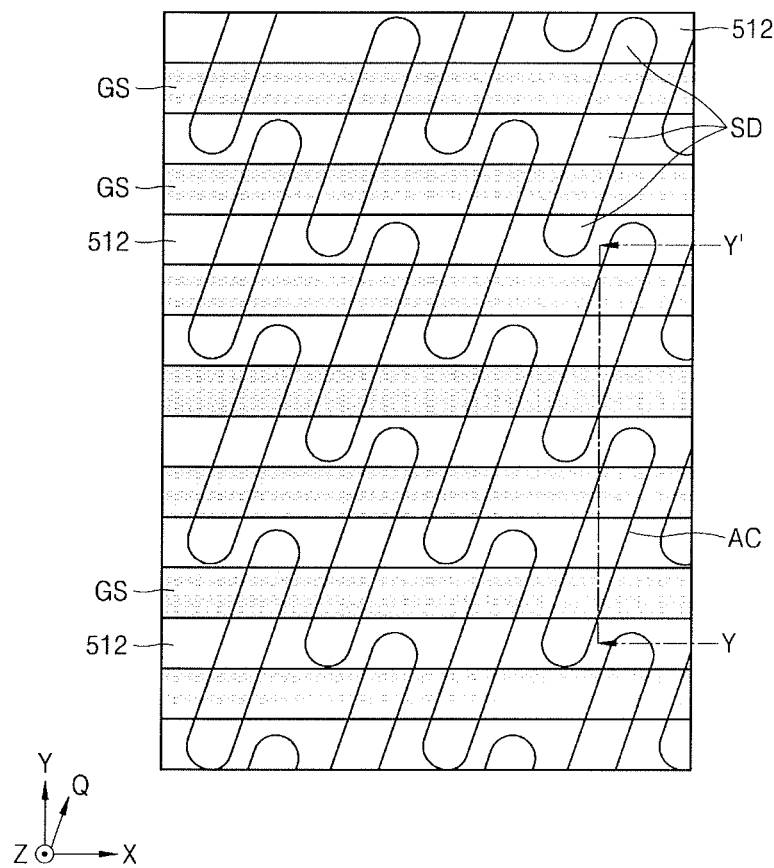
FIG. 19 illustrates a plan layout of key constituent elements of an integrated circuit device according to another embodiment.

FIG. 19 illustrates a plan layout of main constituent elements of an integrated circuit device 500 according to another embodiment.

Referring to FIG. 19, the integrated circuit device 500 may include a plurality of active regions AC defined by a device isolation film 512. The active regions AC may be repeatedly arranged in a separated state from each other in X and Y directions, and may have a shape extending in a slanting direction to have a long-axis in a direction (a Q direction in FIG. 19) which is different from the X and Y directions. The gate structure GS may extend in the X direction across the active regions AC.

FIGS. 20A through 20G illustrate cross-sectional views of stages in a method of manufacturing an integrated circuit device according to another embodiment. An example method of forming the example integrated circuit device 500 of FIG. 19 will be described with reference to FIGS. 20A through 20G. In FIGS. 20A through 20G, main constituent elements corresponding to a cross-section of a line Y-Y' of FIG. 19 are depicted along process operations.

Figure 20A:
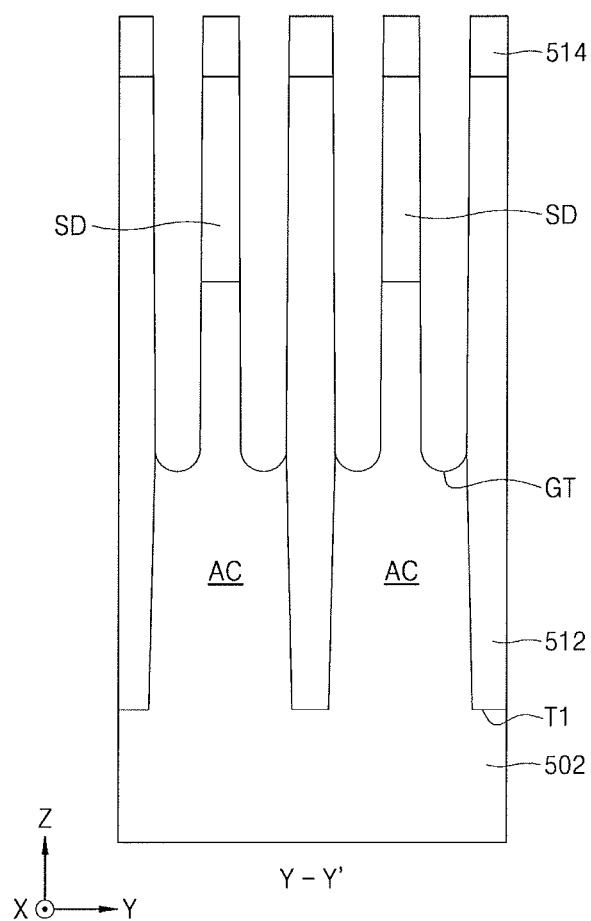
FIGS. 20A through 20G illustrate cross-sectional views of stages in a method of manufacturing an integrated circuit device according to another embodiment.

Referring to FIG. 20A, device isolation trenches T1 that define a plurality of active regions AC may be formed on a substrate 502, and device isolation films 512 that fills the device isolation trenches T1 around the active regions AC are formed. A plurality of source/drain regions SD are formed in the plurality of the active regions AC. Details about the substrate 502 are generally the same as the substrate 302 described with reference to FIG. 15.

A plurality of mask line patterns 514 are formed on the active regions AC and the device isolation films 512. The mask line patterns 514 are separated from each other and extend parallel to each other in the X direction. The mask line patterns 514 may include an oxide film, a nitride film, or a combination of these materials. A plurality of gate trenches GT extending parallel to each other in the X direction are formed by etching the active regions AC and the device isolation films 512 by using the mask line patterns 514 as etch masks.

Figure 20B:
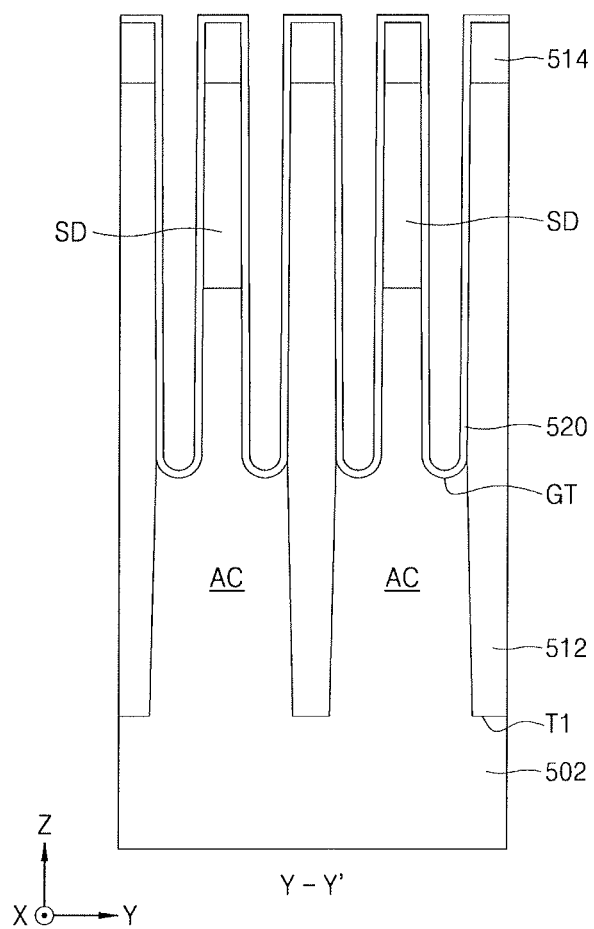

Referring to FIG. 20B, a gate dielectric film 520 covering an inner surface of each of the gate trenches GT is formed. The gate dielectric film 520 may include a high-k dielectric film having a dielectric constant greater than that of a silicon oxide film, a silicon nitride film, a silicon oxynitride film, an oxide/nitride/oxide (ONO) film, or a silicon oxide film. The high-k dielectric film may include $HfO_2$, $Al_2O_3$, $HfAlO_3$, $Ta_2O_3$, or $TiO_2$. A thermal oxidation process, an ALD process, or a combination of these processes may be used to form the gate dielectric film 520.

Figure 20C:
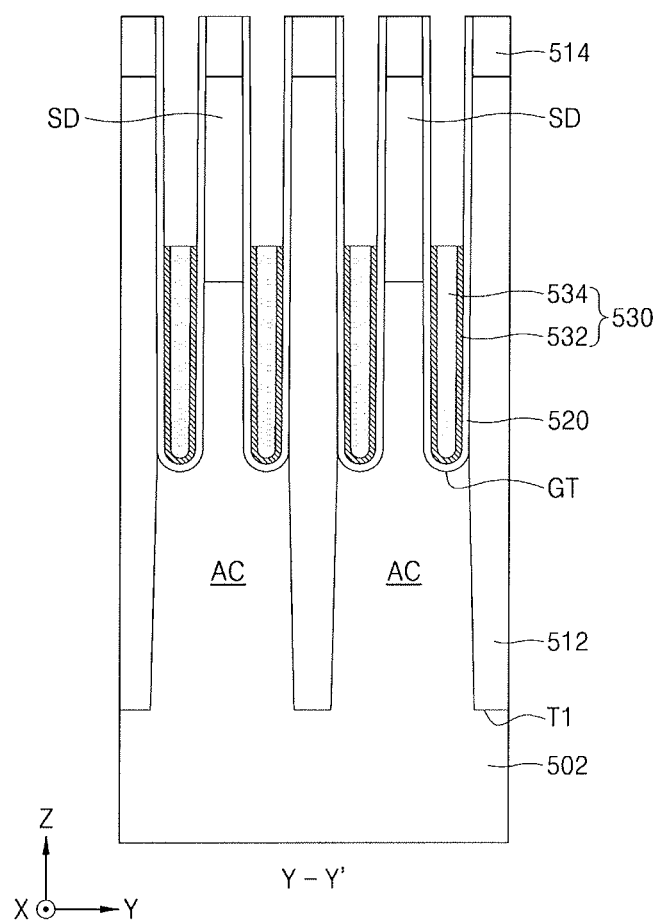

Referring to FIG. 20C, a metal-containing liner 532 and a metal film 534 that fill the gate trenches GT may be formed on a resultant product of FIG. 20B. Afterwards, unnecessary portions of the metal-containing liner 532 and the metal film 534 are removed by an etch-back process to remain portions of the metal-containing liner 532 and the metal film 534 that respectively fill lower parts of the gate trenches GT, and thus, a plurality of gate lines 530 are formed. After the gate lines 530 are formed, upper surfaces of the mask line patterns 514 may be exposed.

The metal-containing liner 532 may include TiN, and the metal film 534 may include W.

Figure 20D:
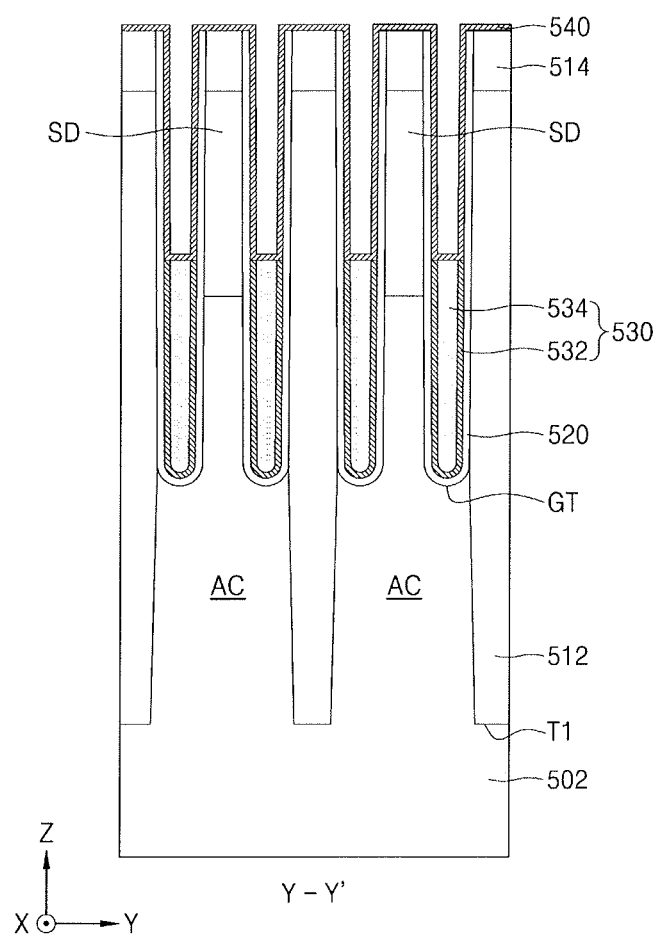

Referring to FIG. 20D, a lanthanum-containing film 540 covering upper surfaces of the gate lines 530 may be formed by using the lanthanum compound of Formula 1 according to the embodiment. In an implementation, the lanthanum-containing film 540 may include a $La_2O_3$ thin film or a LaON thin film. In an implementation, the method described with reference to FIGS. 1 and 2 may be used to form the lanthanum-containing film 540.

In the ALD process for forming the lanthanum-containing film 540, the lanthanum compound of Formula 1 according to the embodiment may provide characteristics suitable for the source compound, e.g., a relatively low melting point, a relatively high vapor pressure, transportability in a liquid state, vaporization easiness, and excellent thermal stability. Accordingly, a process of forming the lanthanum-containing film 540 by using the lanthanum compound of Formula 1 may be readily performed.

Figure 20E:
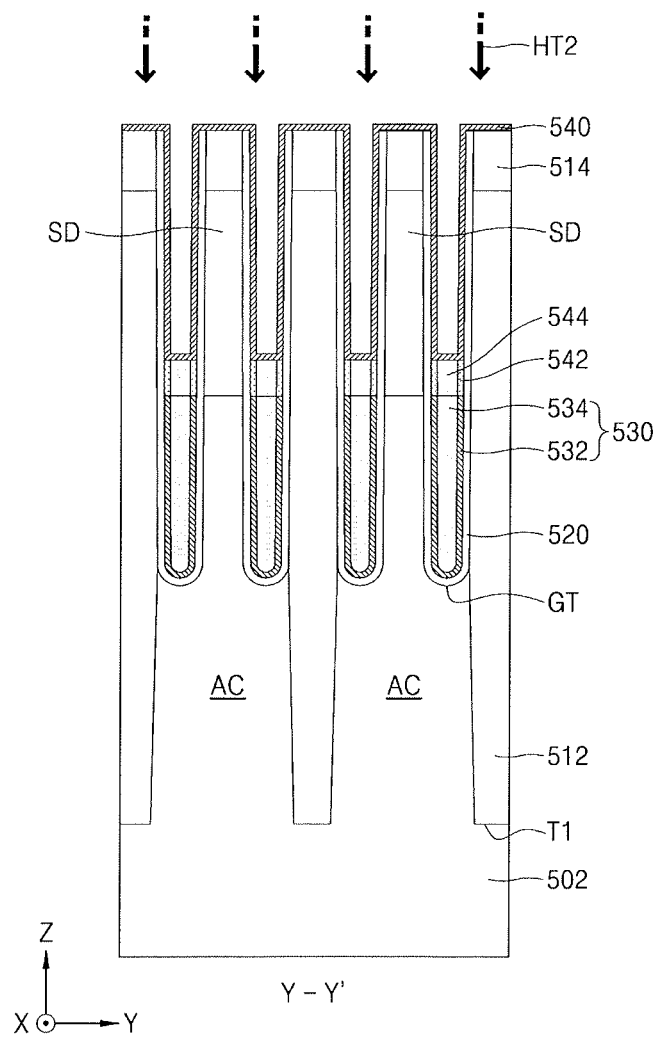

Referring to FIG. 20E, a resultant product in which the lanthanum-containing film 540 is formed is heat-treated HT2 to diffuse La atoms to the metal-containing liner 532 from the lanthanum-containing film 540. Thus, a La-doped metal-containing liner 542 is formed on a portion of an upper region of the metal-containing liner 532. The La-doped metal-containing liner 542 may be used as a work function control layer. In an implementation, the La-doped metal-containing liner 542 may include La-doped TiN film. While the resultant product in which the lanthanum-containing film 540 is formed is heat-treated La atoms may be diffused into an upper portion 544 of the metal film 534.

The heat-treatment HT2 may be performed at, e.g., a temperature in a range of about 400° C. to about 600° C. for about 5 minutes to about one hour. In an implementation, although the heat-treatment HT2 may be omitted, La atoms may be diffused into the portion of the upper region of the metal-containing liner 532 from the lanthanum-containing film 540, and thus, the La-doped metal-containing liner 542 may be formed.

Figure 20F:
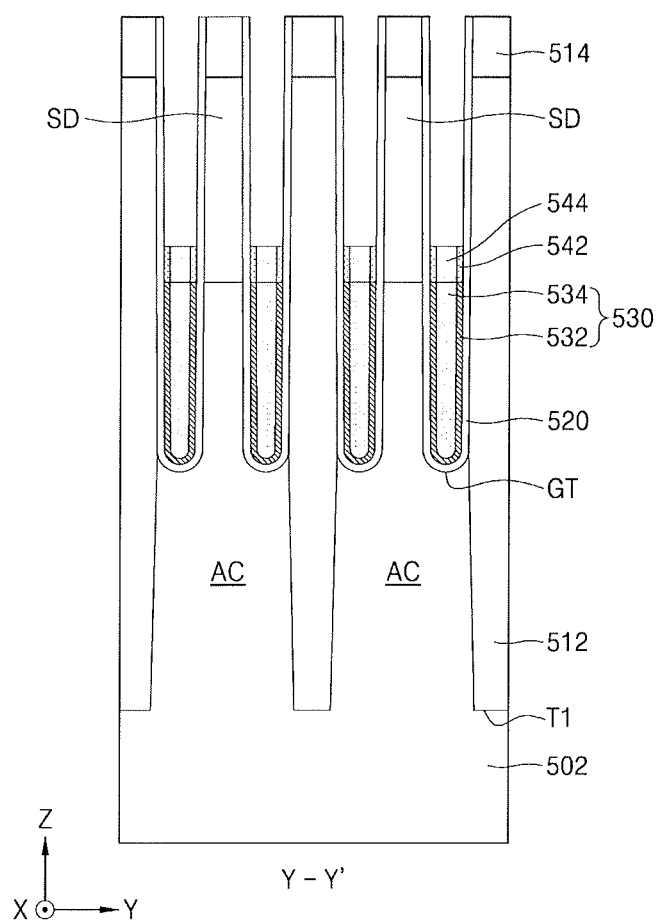

Referring to FIG. 20F, the lanthanum-containing film 540 (refer to FIG. 20E) is removed.

Figure 20G:
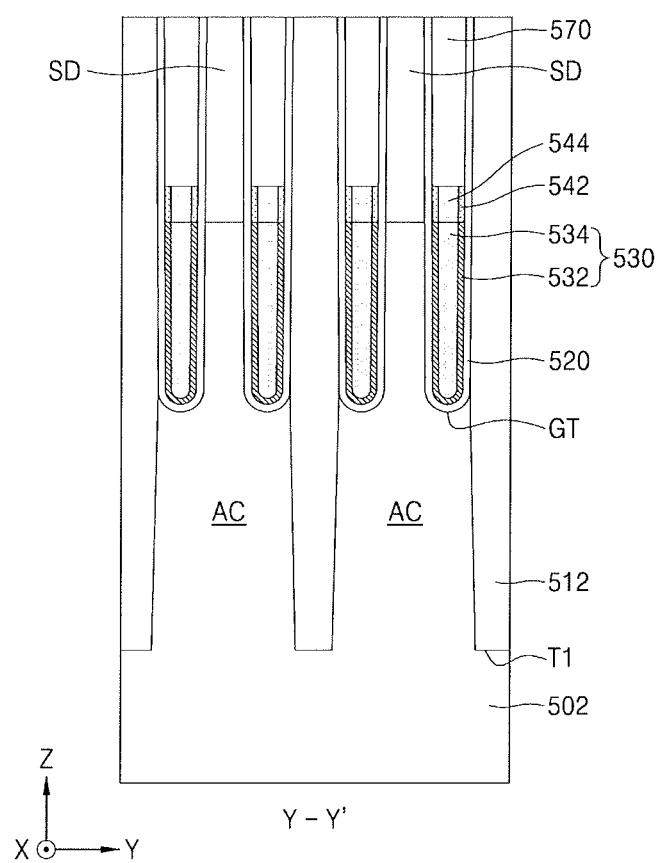

Referring to FIG. 20G, an upper space of each of the gate trenches GT is filled with an insulating capping pattern 570, and afterwards, an upper surface of the substrate 502 is exposed by removing unnecessary films remaining on the substrate 502.

By way of summation and review, techniques of forming lanthanum-containing thin films having a high gap-fill characteristic and a high step-coverage characteristic in a narrow and deep space having a high aspect ratio may be considered.

The embodiments may provide a lanthanum compound, which is a liquid at room temperature, and a method of forming a thin film and an integrated circuit device by using the lanthanum compound.

The lanthanum compound according to an embodiment may have a relatively low melting point, may be easily transported in a liquid state, may be readily vaporized (since it has a relatively high vapor pressure), and may be readily delivered. Thus, the lanthanum compound has appropriate characteristics for a precursor for forming a lanthanum-containing film in a deposition process, e.g., an ALD process or a CVD process, in which a source compound is supplied in a vaporized state. For example, a lanthanum compound (e.g., including an asymmetrical amidinate of the lanthanum compound) according to an embodiment may cause or facilitate a reaction at a relatively low temperature. For example, a lanthanum-containing film may be readily formed at a relatively low deposition temperature. Also, the lanthanum compound (e.g., including the asymmetrical amidinate) may have excellent surface adsorption characteristics, and may be appropriately used in an ALD process.

The embodiments may provide a lanthanum compound having appropriate characteristics for use as a source compound for forming a lanthanum-containing film.

The embodiments may provide a method of forming a thin film using a lanthanum compound having appropriate characteristics for use as a precursor required for forming a lanthanum-containing film.

The embodiments may provide a method of manufacturing an integrated circuit device, the method including a process of forming the lanthanum-containing film having a favorable step-coverage characteristic.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A lanthanum compound represented by Formula 1 below,

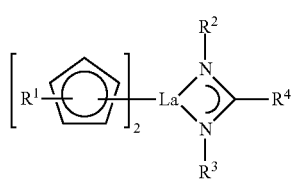

[Formula 1]

wherein, in Formula 1,
  $R^1$ is a hydrogen atom or a C1-C4 linear or branched alkyl group,
  $R^2$ and $R^3$ are each independently a hydrogen atom or a C1-C5 linear or branched alkyl group, at least one of $R^2$ and $R^3$ being a C3-C5 branched alkyl group, and
  $R^4$ is a hydrogen atom or a C1-C4 linear or branched alkyl group,
  wherein the compound is an asymmetrical amidinate in which R1 and $R^3$ are substituents having different structures from each other.

2. The lanthanum compound as claimed in claim 1, wherein:
  one of $R^2$ and $R^3$ is a C3-C5 branched alkyl group, and the other one of $R^2$ and $R^3$ is a C1-C5 linear alkyl group.

3. The lanthanum compound as claimed in claim 1, wherein:
  one of $R^2$ and $R^3$ is an iPr group, an iBu group, a tBu group, or an sBu group, and the other one of $R^2$ and $R^3$ is a Me group, an Et group, an nPr group, or an nBu group.

4. The lanthanum compound as claimed in claim 3, wherein:
  $R^1$ is hydrogen atom, a Me group, an Et group, an nPr group, or an iPr group, and
  $R^4$ is a Me group, an Et group, an nPr group, or an iPr group.

5. The lanthanum compound as claimed in claim 1, wherein the lanthanum compound has a structure represented by one of Chemical Formulae 1 to 4,

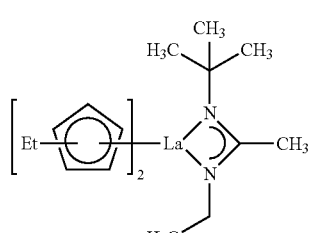

[Chemical Formula 1]

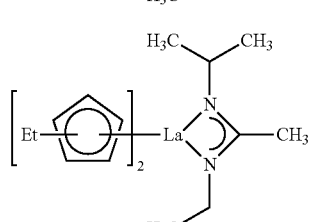

[Chemical Formula 2]

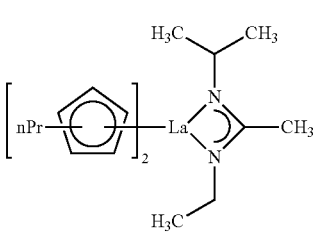

[Chemical Formula 3]

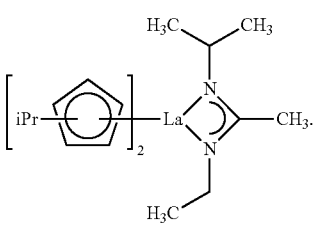

[Chemical Formula 4]

6. The lanthanum compound as claimed in claim 1, wherein the lanthanum compound is a liquid at a temperature between 20° C. to 28° C.

7. A method of synthesizing a thin film, the method comprising forming a lanthanum-containing film on a substrate by using the lanthanum compound as claimed in claim 1, which is a liquid at a temperature between 20° C. to 28° C.

8. The method as claimed in claim 7, wherein forming the lanthanum-containing film includes:
  vaporizing the lanthanum compound represented by Formula 1 in which one of $R^2$ and $R^3$ is a C3-C5 branched alkyl group, and the other one of $R^2$ and $R^3$ is a C1-C5 linear alkyl group;
  forming a La source adsorption layer on the substrate by supplying the vaporized lanthanum compound onto the substrate; and
  supplying a reactive gas onto the La source adsorption layer.

9. The method as claimed in claim 7, wherein forming the lanthanum-containing film includes:
- vaporizing the lanthanum compound represented by Formula 1, in which $R^2$ and $R^3$ are each independently a C3-C5 branched alkyl group, and $R^4$ is a C2-C4 linear or branched alkyl group;
- forming a La source adsorption layer on the substrate by supplying the vaporized lanthanum compound onto the substrate; and
- supplying a reactive gas onto the La source adsorption layer.

10. A method of manufacturing an integrated circuit device, the method comprising:
- forming a lower structure on a substrate; and
- forming a lanthanum-containing film on the lower structure by using the lanthanum compound as claimed in claim 1, and which is a liquid at 20° C. to 28° C.

11. The method as claimed in claim 10, wherein forming the lanthanum-containing film includes using the lanthanum compound represented by Formula 1, in which, in Formula 1, one of $R^2$ and $R^3$ is a C3-C5 branched alkyl group and the other one of $R^2$ and $R^3$ is a C1-C5 linear alkyl group.

12. The method as claimed in claim 10, further comprising diffusing La atoms into a region of the lower structure from the lanthanum-containing film by heat-treating the lanthanum-containing film.

13. The method as claimed in claim 10, wherein forming the lower structure includes:
- forming fin-type active region protruding upwardly from the substrate by etching a portion of the substrate;
- forming an interface layer on surface of the fin-type active region; and
- forming a high-k dielectric film on the interface layer,
- wherein forming the lanthanum-containing film includes forming the lanthanum-containing film on the high-k dielectric film.

14. The method as claimed in claim 13, further comprising diffusing La atoms into an interface between the interface layer and the high-k dielectric film by heat-treating the lanthanum-containing film.

15. The method as claimed in claim 10, wherein forming the lower structure includes:
- forming gate trench in the substrate;
- forming a gate dielectric film covering inner surface of the gate trench; and
- forming a gate line that fills a portion of the gate trench on the gate dielectric film, the gate line including a metal-containing liner covering the gate dielectric film and a metal film surrounded by the metal-containing liner,
- wherein forming the lanthanum-containing film includes forming the lanthanum-containing film on the metal-containing liner, and
- wherein the method further includes forming a La doped metal-containing liner on a portion of an upper region of the metal-containing liner by diffusing La atoms into the metal-containing liner from the lanthanum-containing film, after forming the lanthanum-containing film.

* * * * *